(12) United States Patent
Louie et al.

(10) Patent No.: US 10,643,713 B1
(45) Date of Patent: May 5, 2020

(54) TOGGLING POWER SUPPLY FOR FASTER BIT LINE SETTLING DURING SENSING

(71) Applicant: SanDisk Technologies LLC, Addison, TX (US)

(72) Inventors: Kenneth Louie, Sunnyvale, CA (US); Anirudh Amarnath, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/271,615

(22) Filed: Feb. 8, 2019

(51) Int. Cl.
| | |
|---|---|
| *G11C 16/06* | (2006.01) |
| *G11C 16/24* | (2006.01) |
| *G11C 16/08* | (2006.01) |
| *G11C 16/30* | (2006.01) |
| *G11C 16/34* | (2006.01) |
| *G11C 16/26* | (2006.01) |
| *G11C 16/04* | (2006.01) |

(52) U.S. Cl.
CPC ............. *G11C 16/24* (2013.01); *G11C 16/08* (2013.01); *G11C 16/26* (2013.01); *G11C 16/30* (2013.01); *G11C 16/3459* (2013.01); *G11C 16/0483* (2013.01)

(58) Field of Classification Search
CPC ......... G11C 16/24; G11C 16/08; G11C 16/30; G11C 16/3459; G11C 16/26
USPC .................................................... 365/185.21
See application file for complete search history.

(56) References Cited

U.S. PATENT DOCUMENTS

| | | | |
|---|---|---|---|
| 4,477,736 | A | 10/1984 | Onishi |
| 5,027,320 | A | 6/1991 | Pathak et al. |
| 5,398,201 | A | 3/1995 | Nambu et al. |
| 5,729,492 | A | 3/1998 | Campardo |
| 5,872,739 | A | 2/1999 | Womack |
| 5,903,495 | A | 5/1999 | Takeuchi et al. |

(Continued)

FOREIGN PATENT DOCUMENTS

| | | |
|---|---|---|
| CN | 105185404 A | 12/2015 |
| EP | 1282131 B1 | 9/2006 |

(Continued)

OTHER PUBLICATIONS

Takeuchi, K., et al., An Introduction to Biometric Recognition—IEEE Journals & Magazine, A negative Vth cell architecture for highly scalable, excellently noise immune and highly reliable NAND flash memories, Wiley-IEEE Press, https://ieeexplore.ieee.org/document/688097, Aug. 6, 2002.

(Continued)

*Primary Examiner* — Xiaochun L Chen
(74) *Attorney, Agent, or Firm* — Volpe and Koenig, P.C.

(57) ABSTRACT

A memory device and associated techniques improve a settling time of bit lines in a memory device during a sensing operation, such as read or verify operation. Supply voltage from power supply terminals in the sense circuits is briefly toggled during a discharge of a selected bit line in response to a voltage on a selected word line being increased to a second word line level or higher. This helps to create an electrical path from the selected bit line through to a supply terminal for discharging the selected bit line such that a settling time of a voltage of the selected bit line is shortened in association with a target memory cell transitioning from a non-conductive state to a conductive state.

20 Claims, 18 Drawing Sheets

(56) References Cited

U.S. PATENT DOCUMENTS

| | | | |
|---|---|---|---|
| 6,674,668 B2 | 1/2004 | Ikehashi et al. |
| 6,920,060 B2 | 7/2005 | Chow et al. |
| 7,158,402 B2 | 1/2007 | Houston |
| 7,184,356 B2 | 2/2007 | Noguchi et al. |
| 7,352,626 B1 | 4/2008 | Wu et al. |
| 7,447,079 B2 | 11/2008 | Nguyen et al. |
| 7,529,135 B2 | 5/2009 | Pan et al. |
| 7,590,002 B2 | 9/2009 | Mokhlesi et al. |
| 7,593,265 B2 | 9/2009 | Nguyen et al. |
| 7,732,748 B2 | 6/2010 | Johansson |
| 8,045,391 B2 | 10/2011 | Mokhlesi |
| 8,144,537 B2 | 3/2012 | Mishra et al. |
| 8,279,687 B2 | 10/2012 | Adams et al. |
| 8,665,657 B2 | 3/2014 | Koike et al. |
| 8,670,285 B2 | 3/2014 | Dong et al. |
| 8,971,141 B2 | 3/2015 | Mui et al. |
| 9,036,426 B2 | 5/2015 | Moschiano et al. |
| 9,236,128 B1 | 1/2016 | Louie et al. |
| 9,286,994 B1 | 3/2016 | Chen et al. |
| 9,318,210 B1 | 4/2016 | Hart et al. |
| 9,336,892 B1 | 5/2016 | Chen et al. |
| 9,361,993 B1 | 6/2016 | Chen et al. |
| 9,406,391 B1 | 8/2016 | Chen et al. |
| 9,412,463 B1 | 8/2016 | Chen et al. |
| 9,570,168 B2 | 2/2017 | Lee et al. |
| 9,633,742 B2 | 4/2017 | Desai et al. |
| 9,703,719 B2 | 7/2017 | Balakrishnan et al. |
| 9,704,572 B2 | 7/2017 | Chen et al. |
| 9,747,992 B1 | 8/2017 | Chen et al. |
| 9,761,320 B1 | 9/2017 | Chen et al. |
| 9,922,705 B1 | 3/2018 | Diep et al. |
| 2006/0291291 A1 | 12/2006 | Hosono et al. |
| 2008/0273394 A1 | 11/2008 | Kern |
| 2009/0059686 A1 | 3/2009 | Sung |
| 2009/0323421 A1 | 12/2009 | Lee et al. |
| 2010/0202207 A1 | 8/2010 | Mokhlesi |
| 2011/0019484 A1* | 1/2011 | Mokhlesi ............... G11C 16/26 365/185.21 |
| 2011/0090745 A1 | 4/2011 | La Rosa |
| 2011/0116320 A1 | 5/2011 | Zhang et al. |
| 2011/0261628 A1 | 10/2011 | Keeth et al. |
| 2013/0286738 A1 | 10/2013 | Kamata |
| 2014/0247676 A1 | 9/2014 | Wang et al. |
| 2016/0012903 A1 | 1/2016 | Desai et al. |
| 2017/0062033 A1 | 3/2017 | Fujita |
| 2017/0330615 A1 | 11/2017 | Chou |
| 2017/0352430 A1 | 12/2017 | Chen et al. |
| 2018/0047442 A1 | 2/2018 | Hsu |

FOREIGN PATENT DOCUMENTS

| | | |
|---|---|---|
| EP | 0994483 B1 | 5/2007 |
| WO | 2009145923 A1 | 12/2009 |
| WO | 2016093996 A1 | 6/2016 |

OTHER PUBLICATIONS

Kushwah, Priyanka et al, Reduction of Leakage Power & Noise for DRAM Design using Sleep Transistor Technique, 2015 Fifth International Conference on Advanced Computing & Communication Technologies, Feb. 2015.

Sinha, M. et al. High-performance and low-voltage sense-amplifier techniques for sub-90nm SRAM, IEEE International Converence, Sep. 17-20, 2003, p. 113-116, IEEE, Portland, OR.

Yang, Shao Ming et al., Low-Voltage Embedded NAND-ROM Macros Using Data-Aware Sensing Reference Scheme for VDDmin, Speed and Power Improvement, IEEE Journal of Solid-State Circuits, vol. 48, No. 2, Feb. 2013, 14 pages.

\* cited by examiner

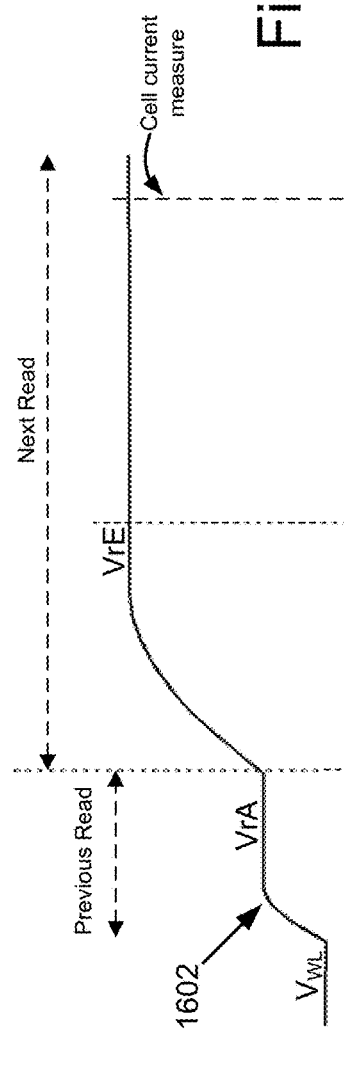
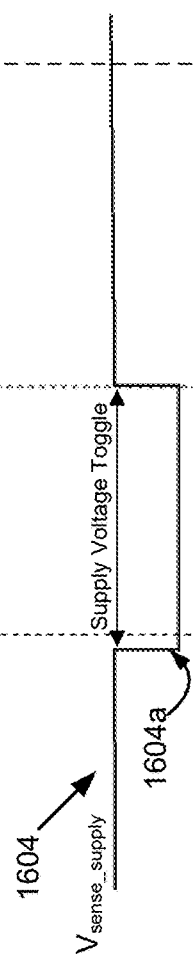
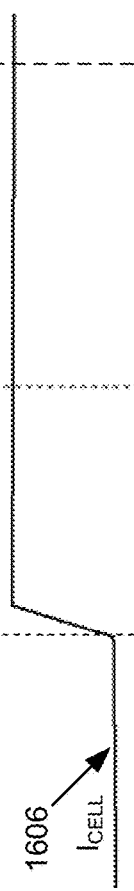
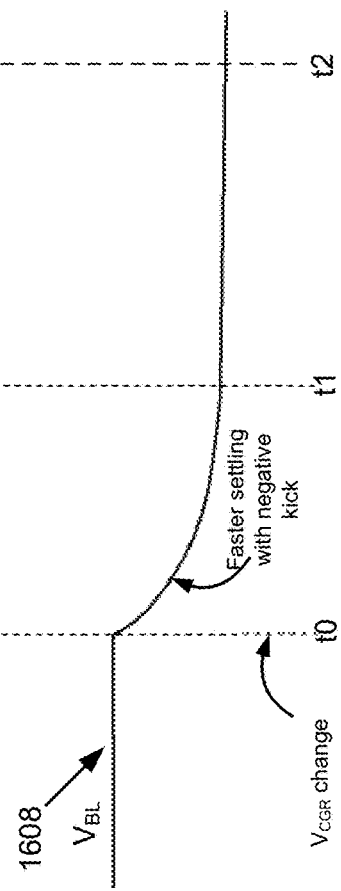
Fig. 16A
Fig. 16B
Fig. 16C
Fig. 16D

TOGGLING POWER SUPPLY FOR FASTER BIT LINE SETTLING DURING SENSING

TECHNICAL FIELD

The present disclosure pertains generally to operation of memory devices, and more specifically to improving bit line settling.

BACKGROUND

A charge-trapping material such as a floating gate or a charge-trapping material can be used in non-volatile memory devices to store a charge that represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A non-volatile memory device includes memory cells which may be arranged in strings, for instance, where select gate transistors are provided at the ends of the string to selectively connect a channel of the string to a source line or bit line. Sense circuits are included on memory dies to sense current flowing through bit lines in order to determine the data values of the data that memory cells are storing or in order to verify that data has been correctly programmed into the memory cells. However, various challenges are present in operating such memory devices. For example, when a sense circuit desires to know the current flow through a bit line, a longer settling time of the bit line undermines the performance of the memory device.

It would be desirable to address at least this issue.

SUMMARY

Apparatuses, methods, systems, and other aspects are presented for improving settling time of bit lines in a memory device during a read or verify operation.

One general aspect includes an apparatus comprising: a control circuit coupled to a set of memory cells. The control circuit comprises a row decoder circuit that is configured to increase a sensing voltage on a selected word line coupled to the set of memory cells, and a voltage supply circuit that is configured to lower a supply voltage to a sense circuit responsive to the sense circuit sensing a first data state of a memory cell such that a voltage of a selected bit line discharges through a voltage terminal that supplies the supply voltage in association with the memory cell transitioning from a non-conductive state to a conductive state, the memory cell coupled to the selected bit line.

Some implementations may optionally include one or more of the following features: that the voltage supply circuit is configured to lower the supply voltage relative to the increase of the sensing voltage; that the voltage supply circuit is configured to lower the supply voltage from a first level to ground; that the voltage supply circuit is further configured to raise the supply voltage from the ground back up to the first level in response to the voltage of the selected bit line discharging from an initial level to a new level; that the sense circuit is configured to sense a second data state of the memory cell in response to the voltage supply circuit raising the supply voltage; that the voltage supply circuit is configured to lower the supply voltage from the first level to ground to shorten a settling time of the voltage of the selected bit line by a factor of about 10; that the row decoder circuit is configured to apply a series of increasing sensing voltages to the selected word line during a sequential sensing operation; that the voltage supply circuit is configured to lower the supply voltage relative to the increase of the sensing voltage to a second level or higher in the series of the increasing sensing voltages; and that the voltage of the selected bit line is discharged through a path connecting the selected bit line to the voltage terminal.

Another general aspect includes a system comprising: a control circuit coupled to a set of memory cells and configured to sense a data state of a memory cell coupled to a bit line. The control circuit comprises: a row decoder circuit configured to increase a sensing voltage from a first read level to a second read level on a word line coupled to the set of memory cells, a current sense circuit configured to sense the data state of the memory cell corresponding to the sensing voltage, and a voltage supply circuit configured to decrease, from a first level to a second level, a supply voltage to the current sense circuit to accelerate discharge of a capacitance of the bit line through a voltage terminal supplying the supply voltage while the memory cell conducts a cell current in relation to the sensing voltage at the second read level in response to the current sense circuit sensing a first data state of the memory cell.

Some implementations may optionally include one or more of the following features: that the voltage supply circuit is further configured to hold the supply voltage at the second level for a predetermined duration of time and then increase the supply voltage from the second level to the first level; that the voltage supply circuit is further configured to increase the supply voltage from the second level back up to the first level in response to a settling of a voltage of the bit line; that the current sense circuit is further configured to sense a second data state of the memory cell in response to a settling of a voltage of the bit line; that the first level is a range between about 2.2V and about 2.5V and the second level is a range between about 0V and about 1V; that a rate of settling of a voltage of the bit line is proportional to a difference in voltage drop between the first level and the second level; and that the discharge of the capacitance of the bit line through the voltage terminal reduces a settling time of a voltage of the bit line by a factor about 10.

Another general aspect includes a method comprising: raising, during sensing of data states, a voltage on a selected word line from a first sensing voltage to a second sensing voltage, the selected word line coupled to a set of memory cells, in response to sensing a first data state of a memory cell, sinking current from a selected bit line of the memory cell through a voltage terminal driving the selected bit line by ramping down a supply voltage of the voltage terminal during a turning on of the memory cell in relation to the second sensing voltage, after a predetermined duration, ramping up the supply voltage of the voltage terminal; and sensing a second data state of the memory cell in response to ramping up the supply voltage of the voltage terminal.

Some implementations may optionally include one or more of the following features: that sinking the current settles a voltage of the selected bit line; that sinking the current reduces a settling time of a voltage of the selected bit line from about 11 microseconds to about 1 microsecond; and that the predetermined duration is about 100 nanoseconds.

Note that the above list of features is not all-inclusive, and many additional features and advantages are contemplated and fall within the scope of the present disclosure. Moreover, the language used in the present disclosure has been principally selected for readability and instructional purposes, and not to limit the scope of the subject matter disclosed herein.

BRIEF DESCRIPTION OF THE DRAWINGS

FIGS. 16A to 16D depict example plots of voltages and currents in the sensing process of FIG. 15.

The Figures depict various embodiments for purposes of illustration only. It should be understood that alternative embodiments of the structures and methods illustrated herein may be employed without departing from the principles described herein.

DETAILED DESCRIPTION

Innovative technology, including various aspects such as apparatuses, processes, methods, systems, etc., is described for improving settling time of bit lines in a memory device during a read or verify operation. In the following description, for purposes of explanation, numerous specific details are set forth to provide a thorough understanding of the various aspects of different example embodiments. Note that any particular example embodiment may in various cases be practiced without all of the specific details and/or with variations, permutations, and combinations of the various features and elements described herein.

As described in detail below, in some memory devices, the memory cells are joined to one another such as in NAND strings in a block or sub-block. Each NAND string includes a number of memory cells connected in series between one or more drain-side select gate transistors (SGD transistors), on a drain-side of the NAND string which is connected to a bit line, and one or more source-side select gate transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical memory strings in a stack, where the stack includes alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 11A:
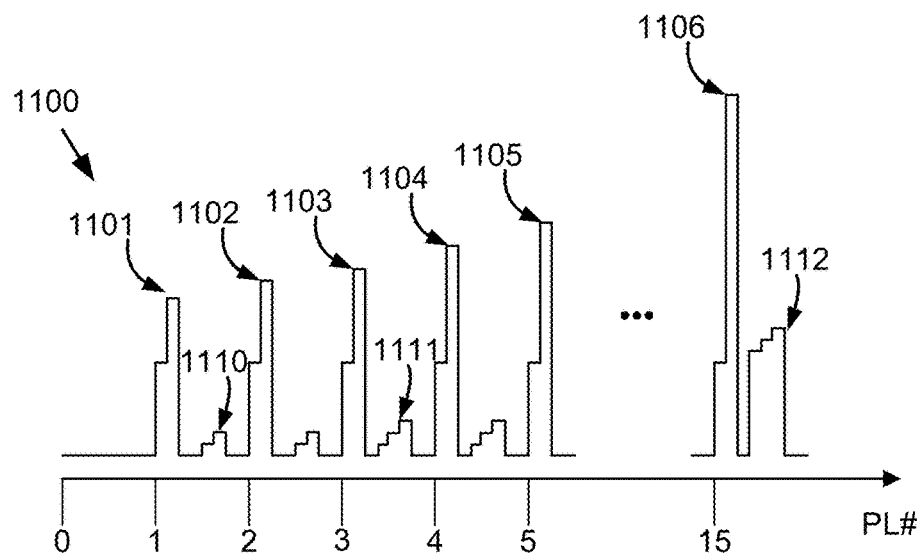
FIG. 11A depicts a waveform of an example programming operation.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. In one approach, programming a word line corresponds to programming a page of memory cells. A programming pass may include a set of increasing program voltages which are applied to the word line in respective program loops or program-verify iterations, such as depicted in FIG. 11A. Verify operations may be performed after each program voltage to determine whether the memory cells have successfully completed programming by reading back the data in the memory cells. When programming is verified as completed for a memory cell, it can be locked out from further programming (e.g., program-inhibited) while programming continues for other memory cells in subsequent program loops until all memory cells in the page have been program-verified.

The memory cells may also be programmed according to a sub-block programming order, where memory cells in one sub-block, or a portion of a block, are programmed before programming memory cells in another sub-block.

Each memory cell may be associated with a data state according to write data associated with a program command. Generally, a memory device includes memory cells which store words of user data as code words. Each code word includes symbols, and each data state represents one of the symbols. When a cell stores n bits of data, the symbols can have one of 2^n possible values. The data states include an erased state and one or more programmed states. A programmed state is a data state to which a memory cell is to be programmed in a programming operation. The symbol or data state which is to be represented by a memory cell is identified by one or more bits of write data in latches associated with the memory cell. This data state is the assigned data state. Each data state corresponds to a different range of threshold voltages (Vth). Moreover, a programmed state is a state which is reached by programming a memory cell so that its Vth increases from the Vth range of the erased state to a higher Vth range. Based on its assigned data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B, and C data states (see FIG. 10A). In a three-bit per cell memory device, there are eight data states including the erased state and seven higher data states referred to as the A, B, C, D, E, F and G data states (see FIG. 10B). In a four-bit per cell memory device, there are sixteen data states including the erased state and fifteen higher data states. The data states may be referred to as the S0-S15 data states where S0 is the erased state.

After the memory cells are programmed, the data can be read back in a verify operation. A sense operation, such as a sequential read operation can involve applying a series of read voltages to a word line while a sense circuit determines whether cells connected to the word line are in a conductive or non-conductive state. If a cell is in a non-conductive state, the Vth of the memory cell exceeds the read voltage applied to the word line. The read voltages are set at levels which are expected to be between the threshold voltage levels of adjacent data states. During the read operation, the voltages of the unselected word lines are ramped up to a read pass level which is high enough to place the unselected memory cells in a strongly conductive state, to avoid interfering with the sensing of the selected memory cells. See FIG. 11C.

Both reading and verifying operations are performed by executing one or more sensing cycles in which the conduction current or threshold voltage of each memory cell of the page is determined relative to a demarcation value. In general, if the memory is partitioned into n states, there will be at least n−1 sensing cycles to resolve all possible memory states. In many implementations, each sensing cycle may also involve two or more passes. For example, when the memory cells are closely packed, interactions between neighboring memory cells become significant and some sensing techniques involve sensing memory cells on neighboring word lines in order to compensate for errors caused by these interactions.

A sense operation, such as a read operation may involve reading a number of pages of data. Reading a page of data may involve waiting for voltage of the word lines and bit lines to settle before sensing can be performed on the bit lines. Various approaches can be used to sense the bit line. One approach is using current sensing to determine a level of conduction current which flows through at least a memory cell and sinks into a source based on the programmed data state of the memory cell. The memory cell coupled to a word line may transition from a non-conductive state (e.g., 'off' state) to a conductive state (e.g., 'on' state) when the read voltage on the selected word line is changed to a higher level in a sequential read operation. When the memory cell transitions from the 'off' state to the 'on' state, a current ICELL flows in the NAND string, which discharges a capacitance of the bit line such that a change in the level of current is visible from the sense circuit (e.g., a sense amplifier) during current sensing. However, a settling of the voltage of the bit line for sensing is slowed down by relying on the ICELL flow to discharge the capacitance of the bit line. See FIG. 14.

Techniques provided herein address the above and other issues. In one aspect, a voltage source supplying a voltage to a sense circuit is controlled and the voltage is toggled to below a supply voltage level for a predetermined period to reduce a settling time of a voltage of the bit line. In one embodiment, a voltage of the selected bit line is quickly discharged through a path to a voltage terminal that supplies the voltage to the sense circuit. For example, a voltage supply circuit that provides and controls a supply voltage to the sense circuit lowers the supply voltage after the sense circuit has sensed a data state of a memory cell in a sequential sensing operation. In the sequential sensing operation, a row decoder circuit that applies a sensing voltage to a word line increases the sensing voltage on a selected word line to a second level or higher in a series of sensing voltages for sensing a next data state. When a voltage of the bit line starts to settle in response to a memory cell coupled to the bit line undergoing a transition from an off state to an on state, the voltage of the bit line is quickly discharged through a voltage terminal that provides the supply voltage to the sense circuit. This is done without solely relying on the conduction current ICELL to discharge a capacitance of the bit line. Once the voltage of the bit line has settled, the voltage supply circuit raises the supply voltage supplied to the sense circuit back up to the supply voltage level before the sensing for the next data state commences.

Various other features and benefits are described below.

Figure 1:
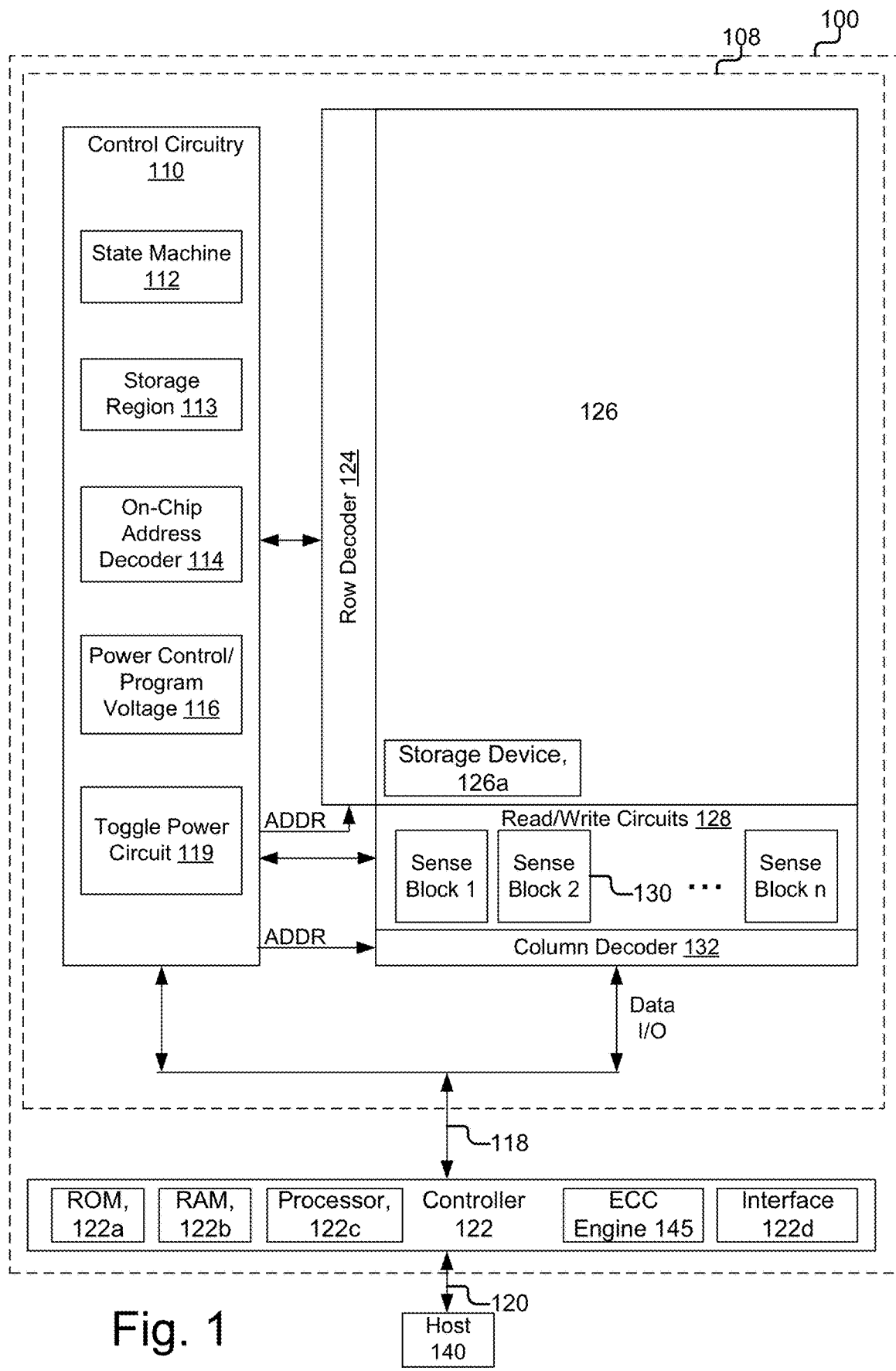
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 130 from 1, 2, . . . , n (sense circuit) and allow a page of memory cells to be read or programmed in parallel. Typically, a controller 122 is included in the same memory device 100 (e.g., a removable storage card) as the one or more memory die 108. The controller 122 may be separate from the memory die 108. Commands and data are transferred between the host 140 and controller 122 via a data bus 120, and between the controller 122 and the one or more memory die 108 via lines 118.

The memory structure 126 can be multidimensional (e.g., 2D or 3D). The memory structure 126 may include one or more array of memory cells including a 3D array. The memory structure 126 may include a monolithic 3D memory structure in which multiple memory levels are formed above (and not in) a single substrate, such as a wafer, with no intervening substrates. The memory structure 126 may include any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126. The control circuitry 110 includes a state machine 112, a storage region 113, an on-chip address decoder 114, a power control/program voltage module 116, and toggle power circuit 119. The state machine 112 provides chip-level control of memory operations. The storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host 140 or a memory controller 122 to the hardware address used by the decoders 124 and 132. The power control module 116 controls the power and voltages supplied to the word lines, select gate lines, bit lines, and source lines during memory operations. It can include drivers for word lines, SGS and SGD transistors and source lines. The sense blocks 130 can include bit line drivers, in one approach. An SGS transistor is a select gate transistor at a source end or source side of a NAND string, and an SGD transistor is a select gate transistor at a drain-end or drain side of a NAND string. In one embodiment, the toggle power circuit 119 can be used to toggle a voltage level of a source voltage supplying power to a sense circuit to below a supply voltage level for a predetermined period to speed up a settling of a voltage of the bit line for sensing a data state. After the voltage of the bit line has settled, the toggle power circuit 119 brings up the voltage back to the supply voltage level before the sense circuit starts the sensing of the bit line. In one embodiment, the power control module 116 and/or the toggle power circuit 119 can be referred to as a voltage supply circuit and used to implement the techniques described herein including the processes of FIG. 15.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit in FIG. 1 may include any one of, or a combination of, control circuitry 110, state machine 112, decoders 114, 124 and 132, power control/program voltage module 116, toggle power circuit 119, sense blocks 130, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 145. The ECC engine 145 can correct a number of read errors.

A memory interface 122d may also be provided. The memory interface 122d, in communication with ROM 122a, RAM 122b, and processor 122c, is an electrical circuit that provides an electrical interface between controller 122 and memory die 108. For example, the memory interface 122d can change the format or timing of signals, provide a buffer, isolate from surges, latch I/O and so forth. The processor 122c can issue commands to the control circuitry 110 (or any other component of the memory die 108) via the memory interface 122d.

A storage device 126a of the memory structure 126 includes code such as a set of instructions, and the processor 122c is operable to execute the set of instructions to provide the functionality described herein. Alternatively or additionally, the processor 122c can access code from the storage device 126a of the memory structure 126, such as a reserved area of memory cells in one or more word lines.

For example, code can be used by the controller 122 to access the memory structure 126, such as for programming, read and erase operations. The code can include boot code and control code (e.g., a set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122b. Once the control code is loaded into the RAM 122b, it is executed by the processor 122c. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host 140 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host 140 may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate (SG) transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

It should be understood that this technology is not limited to the 2D and 3D exemplary structures described, can cover any or all relevant memory structures within the spirit and scope of the technology as described herein.

Figure 2:
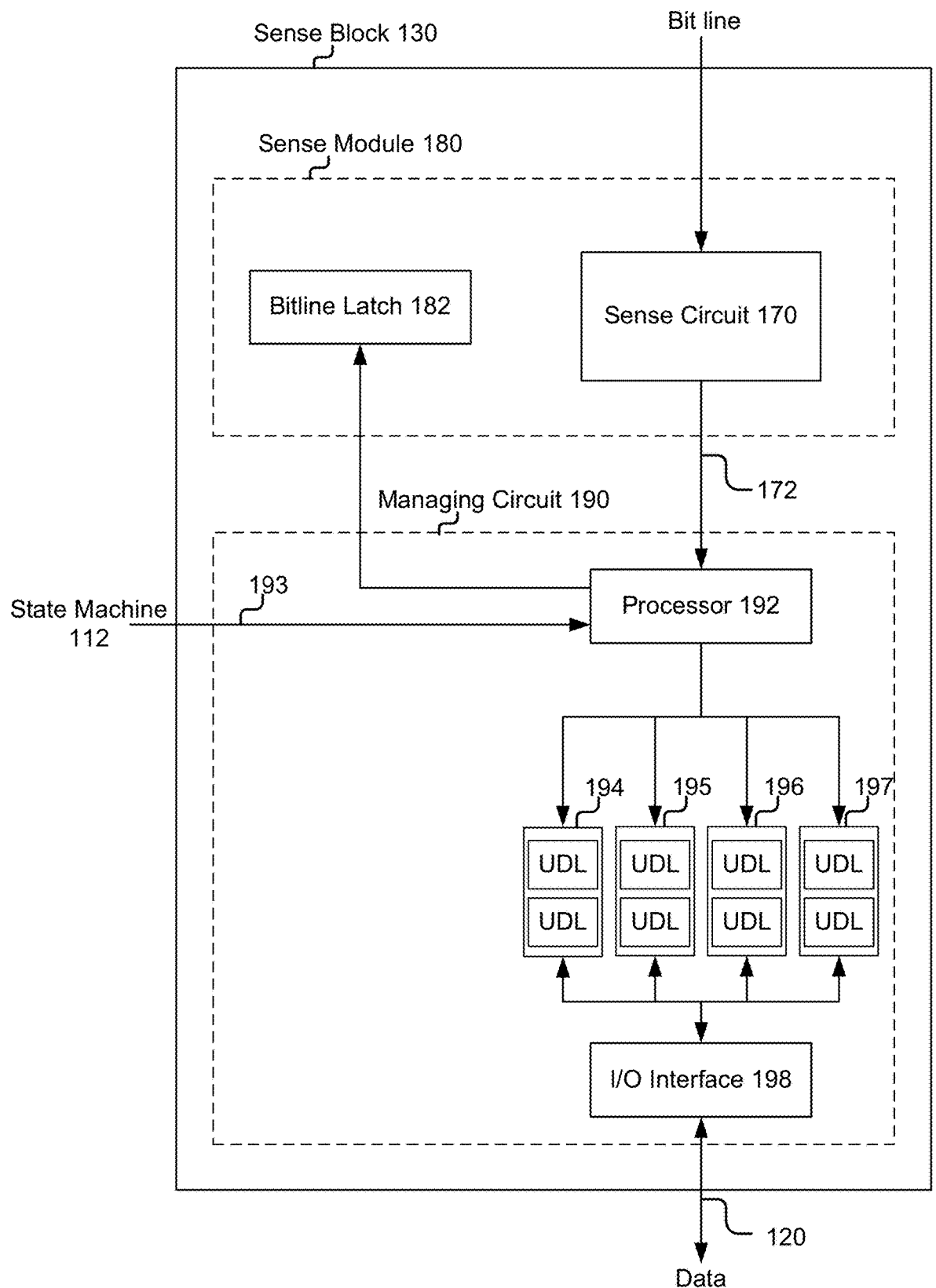
FIG. 2 depicts an example block diagram of a sense block in the column control circuitry of FIG. 1.

FIG. 2 is a block diagram depicting one embodiment of the sense block 130 of FIG. 1. An individual sense block 130 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 includes one or more sense circuits 170 that perform sensing by determining whether conduction currents in connected bit lines are above or below a predetermined threshold level. As described herein, a sense circuit 170 senses current that flows through a given bit line to verify that memory cells of the bit line have been correctly programmed. A sense circuit 170 may be coupled to and sense any suitable number of bit lines. In some implementations, a plurality of sense circuits 170 may be respectively coupled to, and sense current in each of a respective plurality of bit lines or groups of bit lines. In some implementations, the sense circuit 170 controls a voltage of the bit line during data reading, writing, and erasing. During data reading, the sense circuit 170 detects a state of the memory cell at a given word line voltage. The memory cell state represents the data value stored when the memory cell was programmed. Further, during data writing, the sense circuit 170 can apply voltages to the bit line, where the voltages correspond to write data. The sense module 180 can also include a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 198 coupled between the set of data latches 194-197 and data bus 120. One set of data latches can be provided for each sense module 180, and data latches identified by LDL and UDL may be provided for each set. In some cases, additional data latches may be used. LDL stores a bit for a lower page of data, and UDL stores a bit for an upper page of data. This is in a four-level or two-bits per storage element memory device. One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 198 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module 180 and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine 112 receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine 112 knows to terminate the programming process. Because each processor communicates with eight sense modules, the state machine 112 needs to read the wired-OR line eight times, or logic is added to processor 192 to accumulate the results of the associated bit lines such that the state machine 112 need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine 112, includes a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments, the processor 192 initially loads the bit line latch 182 and the sense circuit 170 sets it to an inhibit value during the verify process.

Each set of data latches 194-197 may be implemented as a stack of data latches for each sense module 180. In one embodiment, there are three data latches per sense module 180. In some implementations, the data latches 194-197 are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus 120 in sequence as if they are part of a shift register for the entire read/write block.

The data latches 194-197 identify when an associated storage element has reached certain mileposts in programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
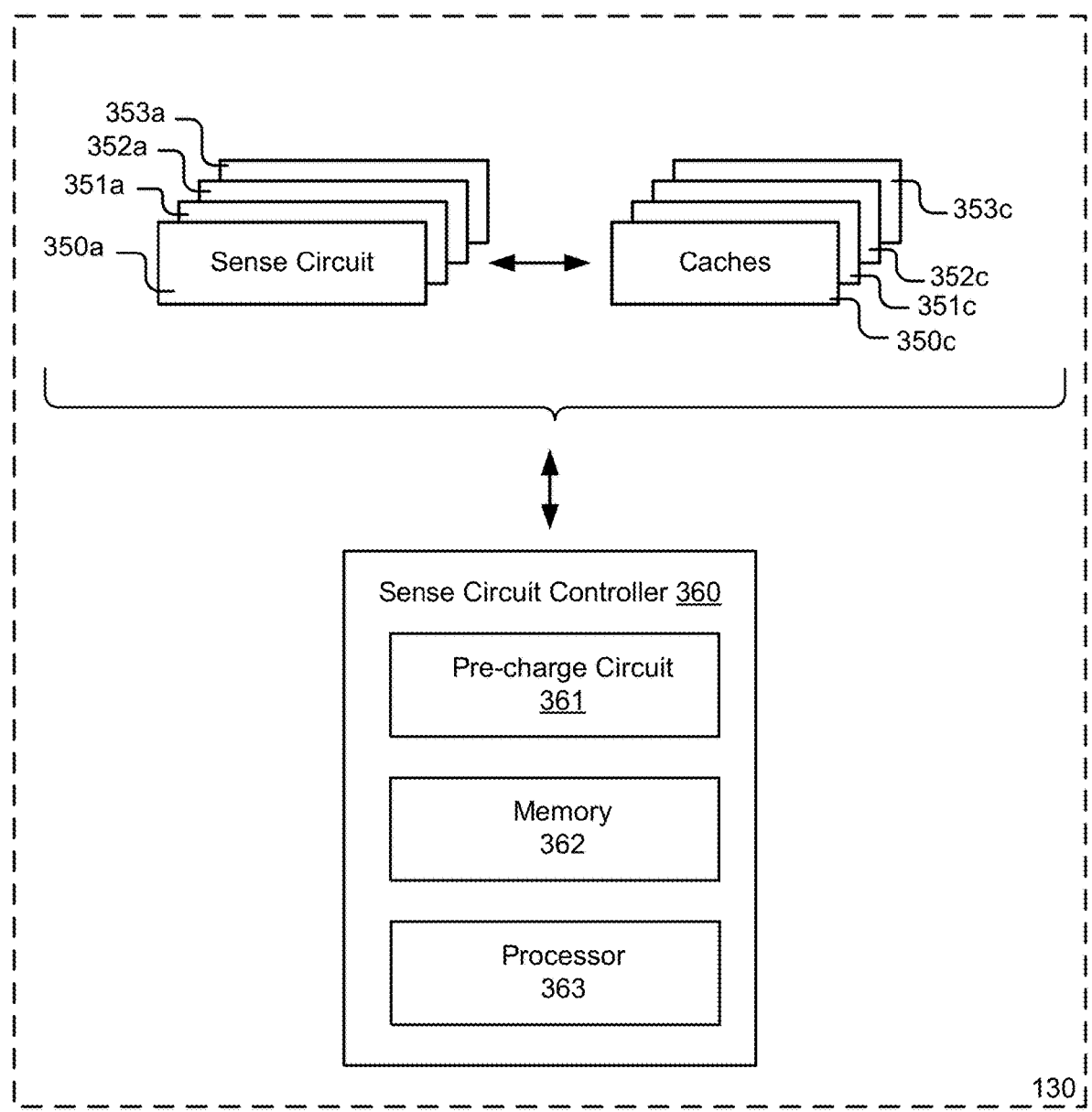
FIG. 3 depicts an example block diagram of a sense block in the column control circuitry of FIG. 1.

FIG. 3 depicts another example block diagram of a sense block 130 in the column control circuitry of FIG. 1. The column control circuitry can include multiple sense blocks, where each sense block performs sensing, e.g., read, program-verify or erase-verify operations for multiple memory cells via respective bit lines. In one approach, a sense block 130 includes multiple sense circuits, also referred to as sense amplifiers. Each sense circuit is associated with data latches and caches. For example, the example sense circuits 350a, 351a, 352a, and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
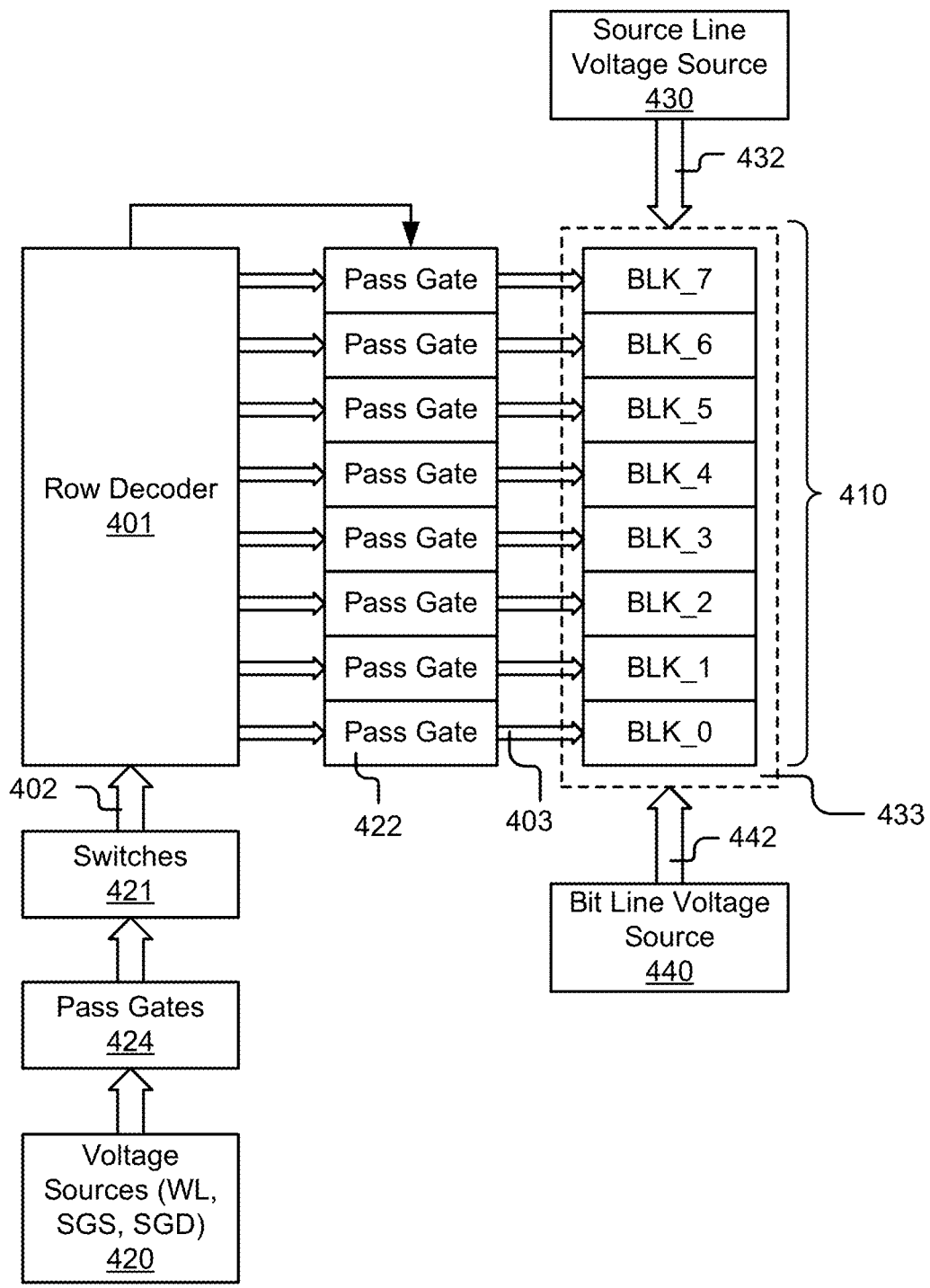
FIG. 4 depicts an example circuit for providing voltages to blocks of memory cells.

FIG. 4 depicts an example circuit for providing voltages to blocks of memory cells. In this example, a row decoder circuit 401 (also simply called row decoder 401) provides voltages to word lines and select gates of each block in the set of blocks 410. The set could be in a plane and includes blocks BLK0 to BLK7, for instance. The row decoder 401 provides a control signal to pass gates 422 which connect the blocks to the row decoder 401. Typically, operations, e.g., program, read or erase, are performed on one selected block at a time. The row decoder 401 can connect global control lines 402 to local control lines 403. The control lines represent conductive paths. Voltages are provided on the global control lines 402 from voltage sources 420. The voltage sources 420 may provide voltages to switches 421 which connect to the global control lines 402. Pass gates 424, also referred to as pass transistors or transfer transistors, are controlled to pass voltages from the voltage sources 420 to the switches 421.

The voltage sources 420 can provide voltages on data and dummy word lines (WL), SGS control gates and SGD control gates, for example.

The various components, including the row decoder 401, may receive commands from a controller such as the state machine 112 or the controller 122 to perform the functions described herein.

A source line voltage source 430 provides a voltage Vsl to the source lines/diffusion region in the substrate via control lines 432. In one approach, the source diffusion region 433 is common to the blocks. A set of bit lines 442 is also shared by the blocks. A bit line voltage source 440 provides voltages to the bit lines. In one possible implementation, the voltage sources 420 are near the bit line voltage source.

Figure 5:
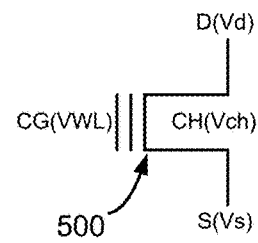
FIG. 5 depicts an example memory cell.

FIG. 5 depicts an example memory cell 500. The memory cell 500 includes a control gate CG which receives a word line voltage Vwl, a drain D at a voltage Vd, a source S at a voltage Vs, and a channel CH at a voltage Vch.

Figure 6:
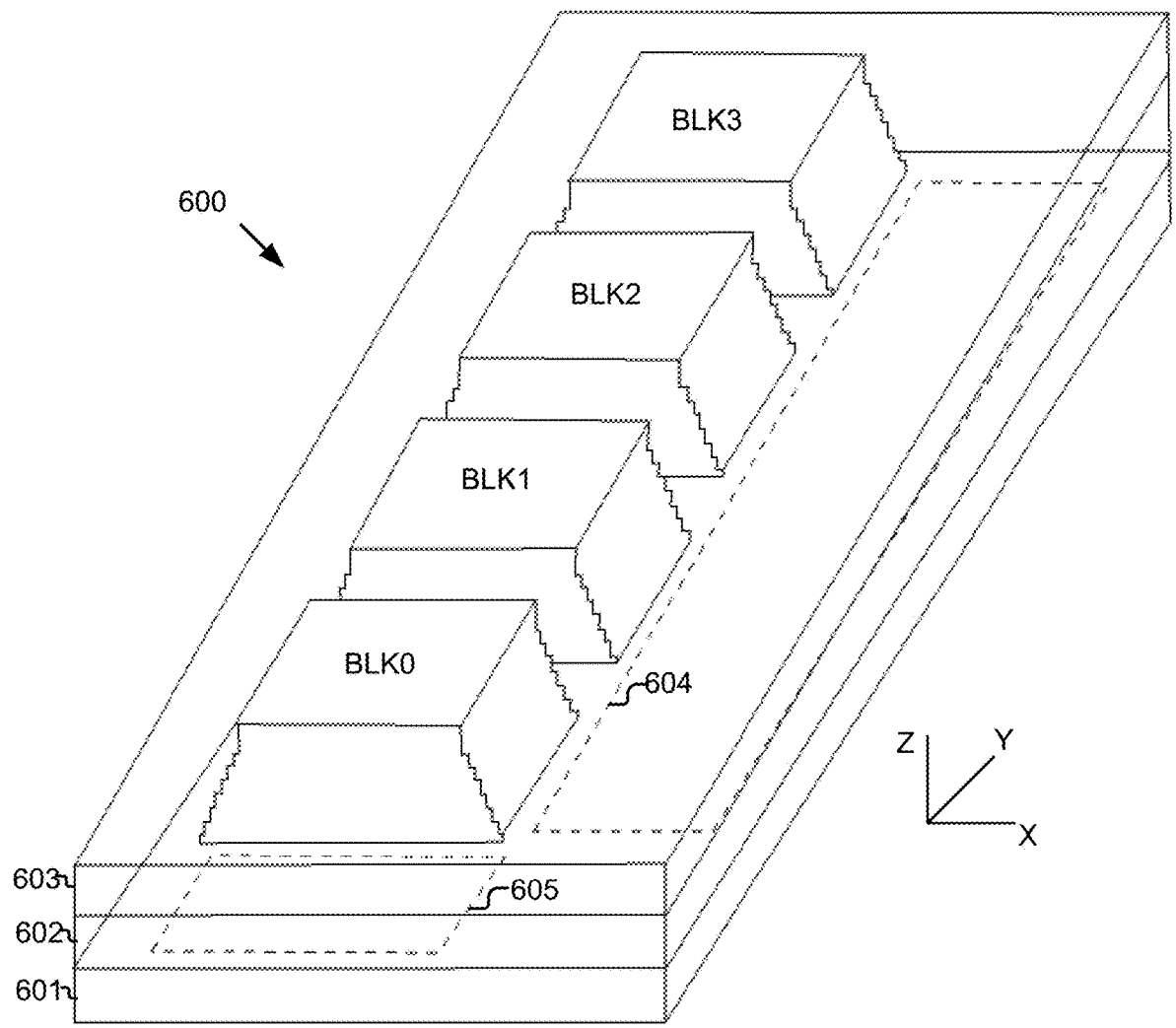
FIG. 6 is a perspective view of a memory device including a set of blocks in an example 3D configuration of the memory structure of FIG. 1.

FIG. 6 is a perspective view of a memory device 600 including a set of blocks in an example 3D configuration of the memory structure 126 of FIG. 1. On the substrate are example blocks BLK0, BLK1, BLK2, and BLK3 of memory cells (storage elements) and peripheral areas with circuitry for use by the blocks. The peripheral area 604 runs along an edge of each block while the peripheral area 605 is at an end of the set of blocks. The circuitry can include voltage drivers which can be connected to control gate layers, bit lines and source lines of the blocks. In one approach, control gate layers at a common height in the blocks are commonly driven. The substrate 601 can also carry circuitry under the blocks, and one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block includes a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions. Typically, the length of the blocks is much longer in the x-direction than the width in the y-direction.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 7A:
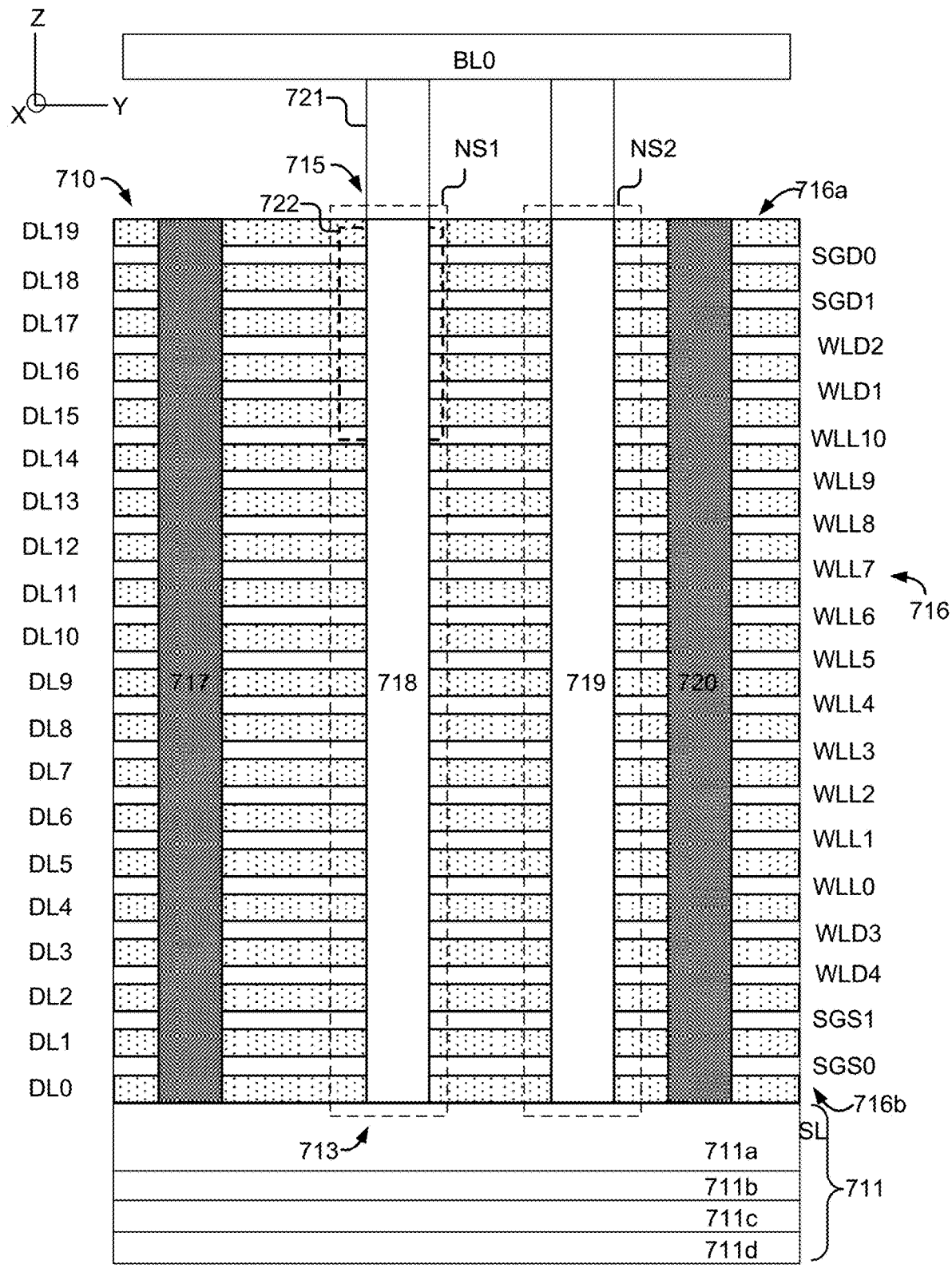
FIG. 7A depicts an example cross-sectional view of a portion of one of the blocks of FIG. 6.

FIG. 7A depicts an example cross-sectional view of a portion of one of the blocks of FIG. 6. The block includes a stack 710 of alternating conductive and dielectric layers. The block includes conductive layers spaced apart vertically, and the conductive layers include word lines connected to the memory cells and select gate lines connected to SGD and SGS transistors.

In this example, the conductive layers comprise two SGD layers, two SGS layers, two source side dummy word line layers (or word lines) WLD3 and WLD4, two drain side dummy word line layers WLD1 and WLD2, and eleven data word line layers (or data word lines) WLL0-WLL10. WLL0 is a source side data word line and WLD3 is a dummy word line layer which is adjacent to the source side data word line. WLD4 is another dummy word line layer which is adjacent to WLD3. WLL10 is a drain side data word line and WLD1 is a dummy word line layer which is adjacent to the drain side data word line. WLD2 is another dummy word line layer which is adjacent to WLD1. The dielectric layers are labeled as DL0-DL19. Further, regions of the stack which include NAND strings NS1 and NS2 are depicted. Each NAND string encompasses a memory hole 718 or 719 which is filled with materials which form memory cells adjacent to the word lines. Region 722 of the stack is shown in greater detail in FIG. 7B.

The stack includes a substrate 711. In one approach, a portion of the source line SL includes an n-type source diffusion layer 711a in the substrate which is in contact with a source end of each string of memory cells in a block. The n-type source diffusion layer 711a is formed in a p-type well region 711b, which in turn is formed in an n-type well region 711c, which in turn is formed in a p-type semiconductor substrate 711d, in one possible implementation. The n-type source diffusion layer may be shared by all of the blocks in a plane, in one approach.

NS1 has a source-end 713 at a bottom 716b of the stack 716 and a drain-end 715 at a top 716a of the stack. Metal-filled slits 717 and 720 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 721 connects the drain-end 715 to BL0.

In one approach, the block of memory cells includes a stack of alternating control gate and dielectric layers, and the memory cells are arranged in vertically extending memory holes in the stack.

In one approach, each block comprises a terraced edge in which vertical interconnects, e.g., pillars or posts, connect to each layer, including the SGS, WL and SGD layers, and extend upward to horizontal paths to voltage sources.

This example includes two SGD transistors, two drain side dummy memory cells, two source side dummy memory cells and two SGS transistors in each string, as an example. Generally, one or more SGD transistors and one or more SGS transistors may be provided in a memory string.

An isolation region IR may be provided to separate portions of the SGD layers from one another to provide one independently driven SGD line or layer portion per sub-block. The isolation region includes an insulating material such as oxide. In one example, the word line layers are common to all sub-blocks in a block.

Figure 7B:
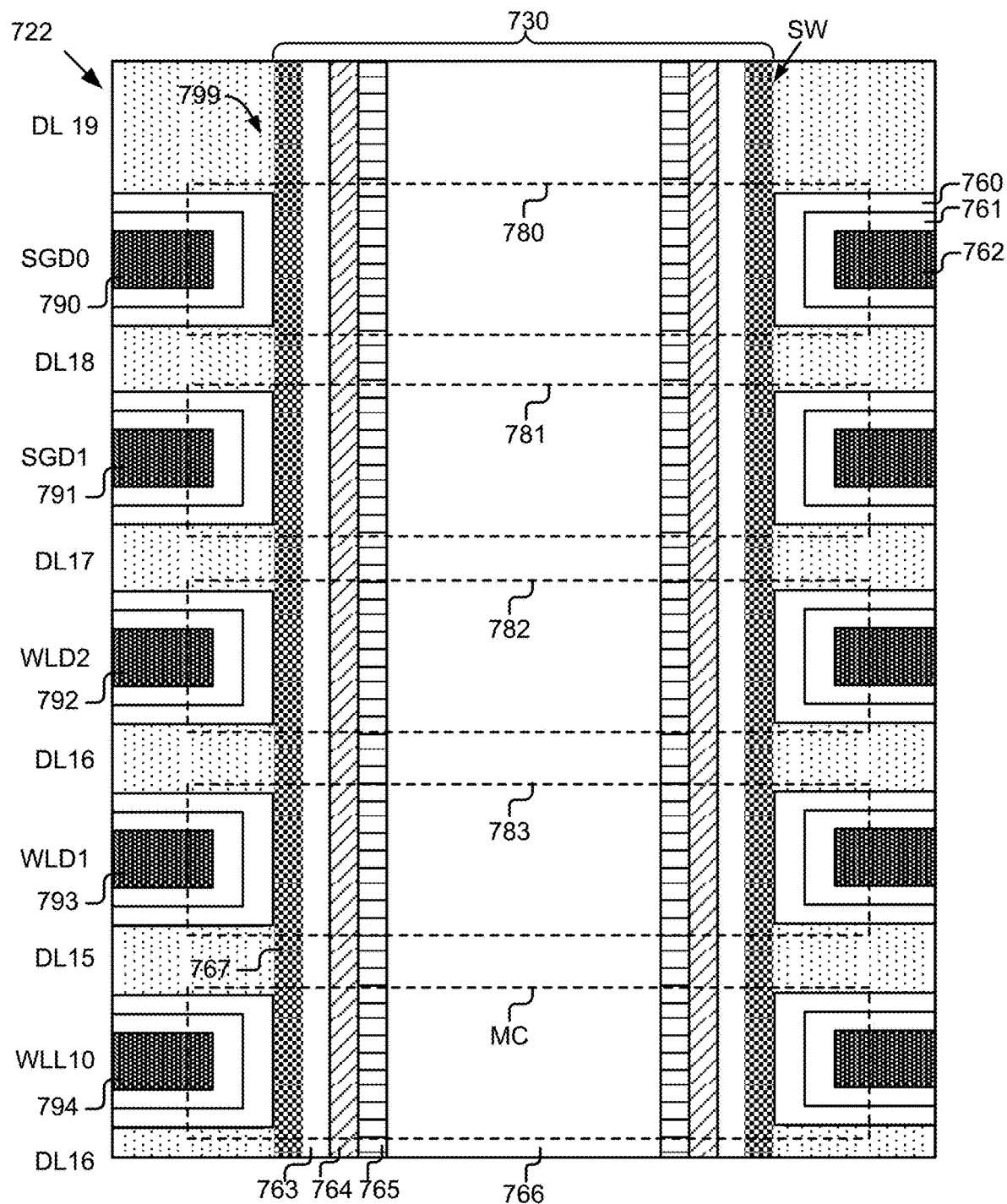
FIG. 7B depicts a close-up view of a region of FIG. 7A.

FIG. 7B depicts a close-up view of the region 722 of FIG. 7A. Memory cells are formed at the different levels of the stack at the intersection of a word line layer and a memory hole. In this example, SGD transistors 780, and 781 are provided above dummy memory cells 782 and 783 and a data memory cell MC. A number of layers can be deposited along the sidewall (SW) of the memory hole 730 and/or within each word line layer, e.g., using atomic layer deposition. For example, each pillar 799 or column which is formed by the materials within a memory hole 730 can include a blocking oxide 767, a charge-trapping layer 763 or film such as silicon nitride ($Si_3N_4$) or other nitride, a tunneling layer 764, a channel 765 (e.g., comprising polysilicon), and a dielectric core 766. A word line layer can include a blocking oxide/block high-k material 760, a metal barrier 761, and a conductive metal 762 such as Tungsten as a control gate. For example, control gates 790, 791, 792, 793, and 794 are provided. In this example, all of the layers except the metal are provided in the memory hole 730. In other approaches, some of the layers can be in the control gate layer. Additional pillars are similarly formed in the different memory holes. The pillar 799 can form a columnar active area (AA) of a NAND string.

Each memory string includes a channel which extends continuously from the source-end select gate transistor to the drain-end select gate transistor.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers including a blocking oxide layer, a charge trapping layer, a tunneling layer, and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 8:
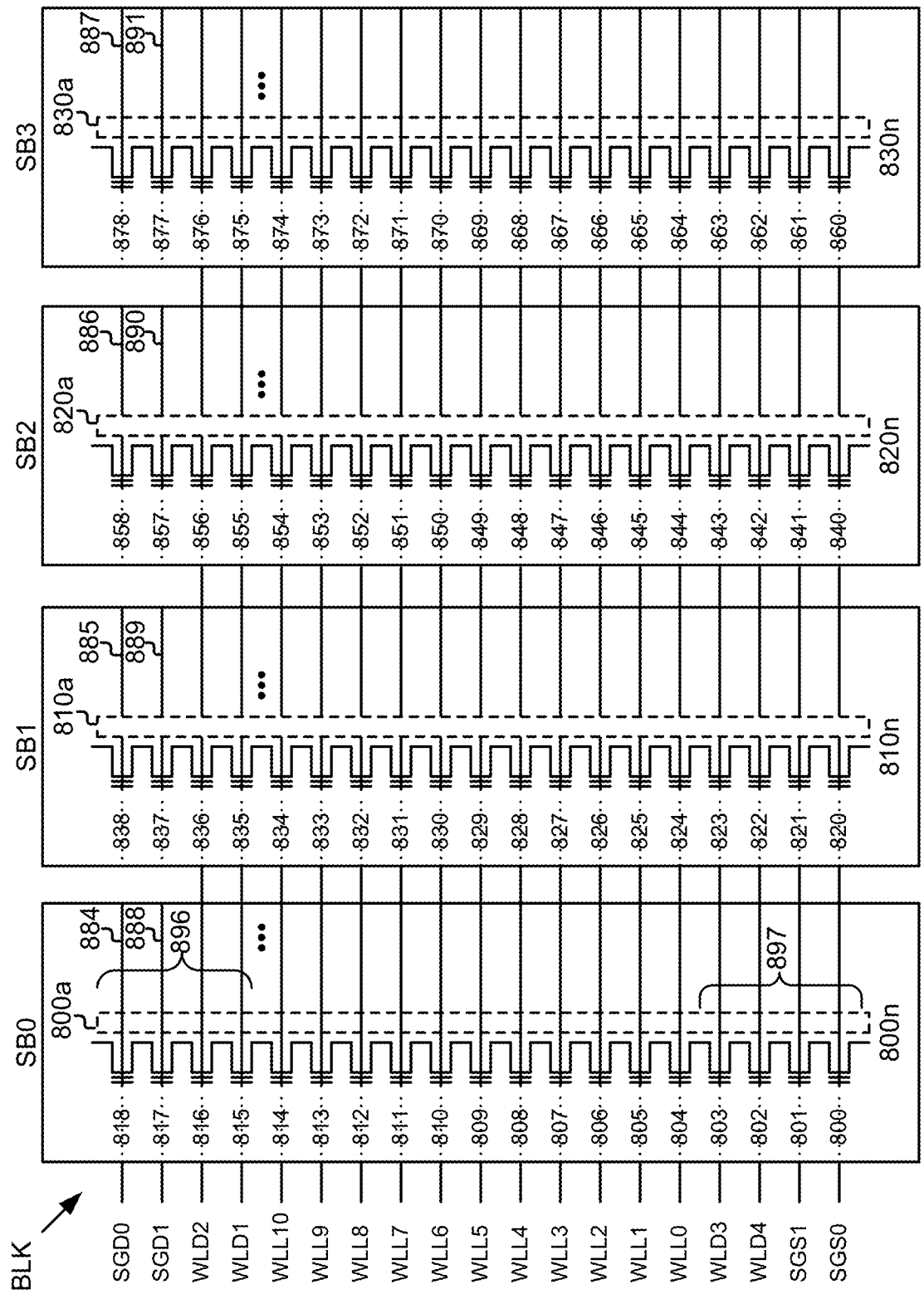
FIG. 8 depicts an example implementation of a memory structure of FIG. 1.

FIG. 8 depicts an example implementation of the memory structure 126 of FIG. 1 including NAND strings in sub-blocks in a 3D configuration. In one approach, a block BLK of memory cells is formed from a stack of alternating conductive and dielectric layers. The block includes conductive layers spaced apart vertically, and the conductive layers spaced apart vertically include word lines connected to the memory cells and select gate lines connected to SGD (drain-side select gate) and SGS (source-side select gate) transistors. In this example, the conductive layers include two SGD layers, two SGS layers and four dummy word line layers (or word lines) WLD1, WLD2, WLD3, and WLD4, in addition to data word line layers (or word lines) WLL0-WLL10. Although not shown, the dielectric layers include DL0-DL19. Each NAND string may be formed in a memory hole in the stack filled with materials which form memory cells adjacent to the word lines.

Further, each block can be divided into sub-blocks and each sub-block includes multiple NAND strings, where one example NAND string is depicted. For example, sub-blocks SB0, SB1, SB2, and SB3 include example NAND strings 800n, 810n, 820n and 830n, respectively. The NAND strings have data word lines, dummy word lines and select gate lines. Each sub-block includes a set of NAND strings which extend in the x direction and which have a common SGD line. SB0 has SGD lines or SGD layer portions 884 and 888 in the SGD0 and SGD1 layers, respectively. SB1 has SGD layer portions 885 and 889 in the SGD0 and SGD1 layers, respectively. SB2 has SGD layer portions 886 and 890 in the SGD0 and SGD1 layers, respectively. SB3 has SGD layer portions 887 and 891 in the SGD0 and SGD1 layers, respectively. Each of the data word line layers WLL0 to WLL10 and the SGS layers SGS0 and SGS1 is shared by all of the sub-blocks SB0 to SB3. The dummy word line layers are also shared by all of the sub-blocks.

The NAND strings 800n, 810n, 820n, and 830n are in sub-blocks SB0, SB1, SB2 and SB3, respectively. Programming of the block may occur one sub-block at a time. Within each sub-block, a word line programming order may be followed, e.g., starting at WL0, the source-side word line and proceeding one word line at a time to WLL10, the drain-side word line.

The NAND strings 800n, 810n, 820n, and 830n have channels 800a, 810a, 820a and 830a, respectively. Each channel has a drain end and a source end. For example, the channel 800a has a drain end 896 and a source end 897.

Additionally, NAND string 800n includes SGS transistors 800 and 801, dummy memory cells 802 and 803, data memory cells 804, 805, 806, 807, 808, 809, 810, 811, 812, 813, and 814, dummy memory cells 815 and 816, and SGD transistors 817 and 818.

NAND string 810n includes SGS transistors 820 and 821, dummy memory cells 822 and 823, data memory cells 824, 825, 826, 827, 828, 829, 830, 831, 832, 833, and 834, dummy memory cells 835 and 836, and SGD transistors 837 and 838.

NAND string 820n includes SGS transistors 840 and 841, dummy memory cells 842 and 843, data memory cells 844, 845, 846, 847, 848, 849, 850, 851, 852, 853, and 854, dummy memory cells 855 and 856, and SGD transistors 857 and 858.

NAND string 830n includes SGS transistors 860 and 861, dummy memory cells 862 and 863, data memory cells 864, 865, 866, 867, 868, 869, 870, 871, 872, 873, and 874, dummy memory cells 875 and 876, and SGD transistors 877 and 878.

Figure 9:
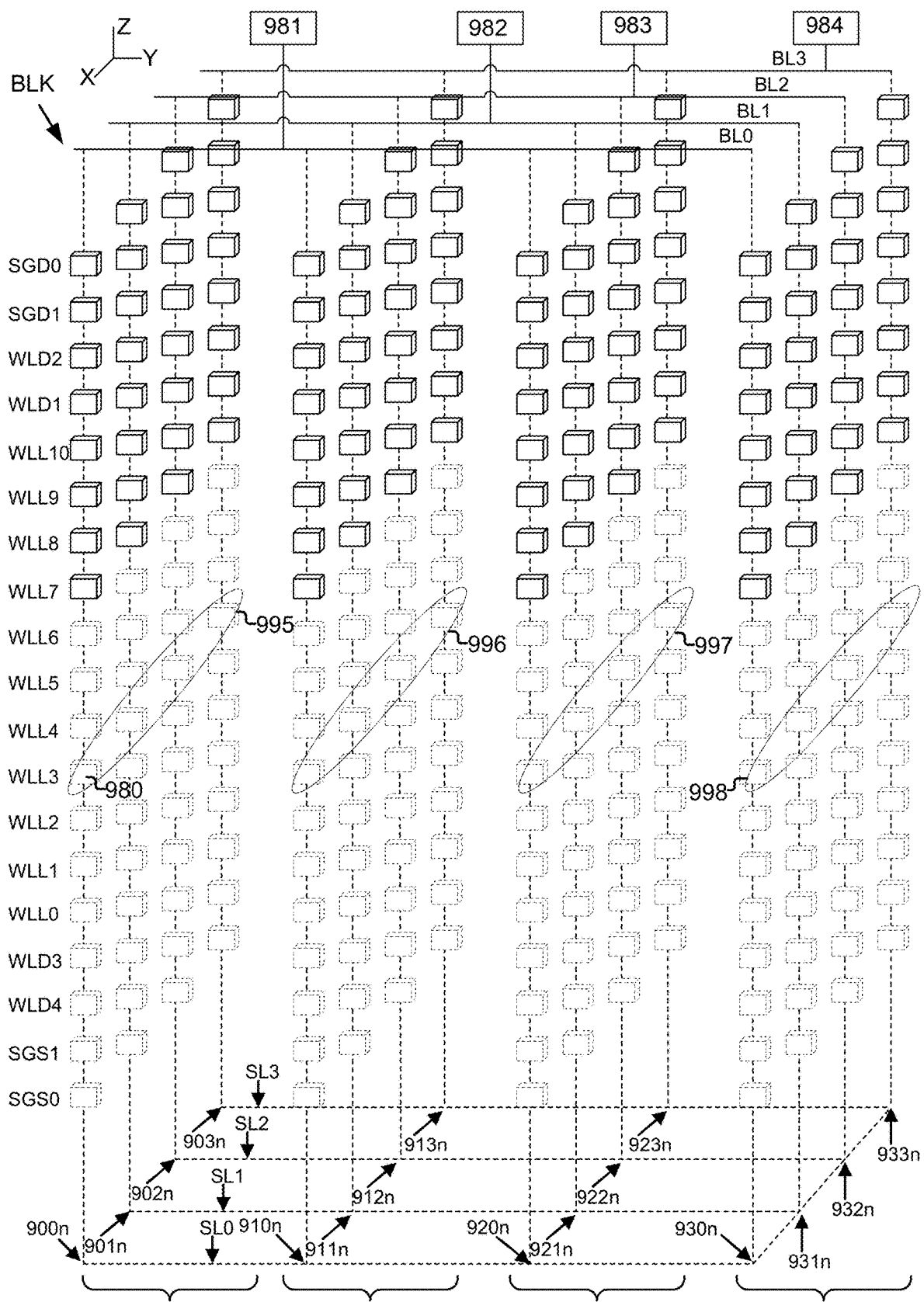
FIG. 9 depicts a further perspective view of the sub-blocks of FIG. 8.

FIG. 9 depicts a further perspective view of the sub-blocks SB0-SB3 of FIG. 8. A sub-block is a portion of a block and represents a set of memory strings which are programmed together and which have a common SGD line. Also, each memory string in a sub-block is connected to a different bit line, in one approach.

Example memory cells are depicted which extend in the x direction along word lines in each sub-block. Each memory cell 980 is depicted as a cube for simplicity. SB0 includes NAND strings 900n, 901n, 902n, and 903n. SB1 includes NAND strings 910n, 911n, 912n, and 913n. SB2 includes NAND strings 920n, 921n, 922n, and 923n. SB3 includes NAND strings 930n, 931n, 932n, and 933n. Bit lines are connected to sets of NAND strings. For example, a bit line BL0 is connected to NAND strings 900n, 910n, 920n, and 930n, a bit line BL1 is connected to NAND strings 901n, 911n, 921n and 931n, a bit line BL2 is connected to NAND strings 902n, 912n, 922n and 932n, and a bit line BL3 is connected to NAND strings 903n, 913n, 923n, and 933n. A sense circuit may be connected to each bit line. For example, sense circuits 981, 982, 983 and 984 are connected to bit lines BL0, BL1, BL2, and BL3, respectively. The NAND strings are examples of vertical memory strings which extend upward from a substrate.

Programming and reading can occur for selected cells of one word line and one sub-block at a time. This allows each selected cell to be controlled by a respective bit line and/or source line. For example, an example set 995 of memory cells (including an example memory cell 980) in SB0 is connected to WLL3. Similarly, the sets 996, 997 and 998 include data memory cells in SB1, SB2 and SB3 are connected to WLL3. In this example, the source lines SL0-SL3 are connected to one another and driven by a common voltage source.

In another approach, the source lines SL0-SL3 can be separate from one another and driven at respective voltages by separate voltage sources.

Figure 10A:
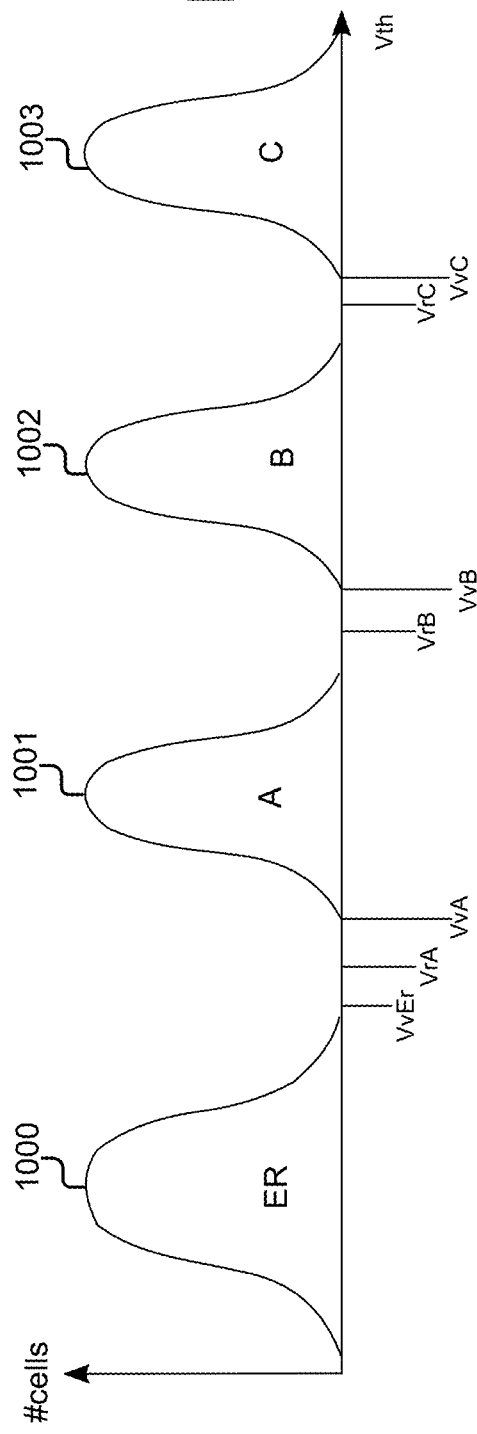
FIG. 10A depicts an example threshold voltage distribution of a set of memory cells in which four data states are used.

FIG. 10A depicts an example threshold voltage (Vth) distribution of a set of memory cells connected to a selected word line after a programming operation in which four data states are used. A Vth distribution 1000 is provided for erased (Er) state memory cells. Three Vth distributions 1001, 1002, and 1003 represent assigned data states A, B, and C, respectively, which are reached by memory cells when their Vth exceeds the erase-verify voltage VvA, VvB, or VvC, respectively. In another approach, a single verify voltage is used which is common to the different assigned data states. This example uses four data states. Other numbers of data states can be used as well, such as eight or sixteen. The optimum read voltages generally are midway between the Vth distributions of adjacent data states. Read voltages VrA, VrB, and VrC are used to read data from a set of memory cells having this Vth distribution. These verify voltages and read voltages are examples of control gate read levels of the selected word line voltage. Each read voltage demarcates a lower boundary of a data state of a plurality of data states. For example, VrA demarcates a lower boundary of the A state. An erase-verify voltage VvEr is used in an erase-verify test to determine whether the erase operation is completed.

During a programming operation, the final Vth distribution can be achieved by using one or more programming passes. Each pass may use incremental step pulse programming, for instance. During a programming pass, program loops are performed for a selected word line. A program loop comprises a program portion in which a program voltage is applied to the word line followed by a verify portion in which one or more verify tests are performed. Each programmed state has a verify voltage which is used in the verify test for the state.

A programming operation can use one or more programming passes. A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vpass (e.g., 8-10 V), also referred to as Vread, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for each state is 11, 10, 00 and 01, respectively, in the format of upper page (UP) bit/lower page (LP) bit. A LP read may use VrA and VrC, and a UP read may use VrB. A lower or upper bit can represent data of a lower or upper page, respectively. With these bit sequences, the data of the lower page can be determined by reading the memory cells using read voltages of VrA and VrC. The lower page (LP) bit=1 if Vth<=VrA or Vth>VrC. LP=0 if VrA<Vth<=VrC. The upper page (UP) bit=1 if Vth<=VrB and LP=0 if Vth>VrB. In this case, the UP is an example of a page which can be read by using one read voltage applied to a selected word line. The LP is an example of a page which can be read by using two read voltages applied to a selected word line.

Figure 10B:
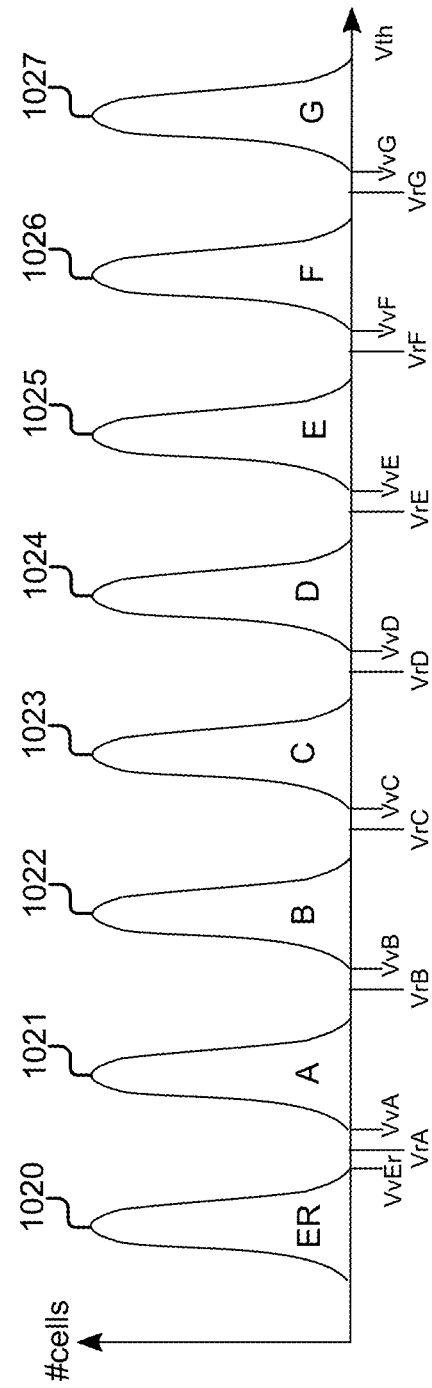
FIG. 10B depicts an example threshold voltage distribution of a set of memory cells in which eight data states are used.

FIG. 10B depicts an example Vth distribution of a set of memory cells in which eight data states are used. For the Er, A, B, C, D, E, F, and G states, we have Vth distributions 1020, 1021, 1022, 1023, 1024, 1025, 1026 and 1027, respectively. For the Er, A, B, C, D, E, F, and G states, we have program-verify voltages VvA, VvB, VvC, VvD, VvE, VvF, and VvG, respectively, in one possible approach. In another approach, a single verify voltage is used which is common to the different assigned data states. For the Er, A, B, C, D, E, F and G states, we have read voltages VrA, VrB, VrC, VrD, VrE, VrF and VrG, respectively, and example encoding of bits of 111, 110, 100, 000, 010, 011, 001 and 101, respectively. The bit format can be: UP/MP/LP. An erase-verify voltage VvEr may be used during an erase operation. An LP read may use VrA and VrE. An MP read may use VrB, VrD, and VrF. A UP read may use VrC and VrG. See FIG. 12.

FIG. 11A depicts a waveform 1100 of an example programming operation. The horizontal axis depicts a program loop (PL) number and the vertical axis depicts a control gate or word line voltage. Generally, a programming operation can involve applying a pulse train to a selected word line, where the pulse train includes multiple program loops or program-verify iterations. The program portion of the program-verify iteration includes a program voltage, and the verify portion of the program-verify iteration includes one or more verify voltages.

Each program voltage includes two steps, in one approach. Further, Incremental Step Pulse Programming (ISPP) is used in this example, in which the program voltage steps up in each successive program loop using a fixed or varying step size. This example uses ISPP in a single programming pass in which the programming is completed. ISPP can also be used in each programming pass of a multi-pass operation.

The waveform 1100 includes a series of program voltages 1101, 1102, 1103, 1104, 1105 . . . 1106 that are applied to a word line selected for programming and to an associated set of non-volatile memory cells. One or more verify voltages can be provided after each program voltage as an example, based on the target data states which are being verified. 0 V may be applied to the selected word line between the program and verify voltages. For example, A- and B-state verify voltages of VvA and VvB, respectively, (waveform 1110) may be applied after each of the program voltages 1101 and 1102. A-, B- and C-state verify voltages of VvA, VvB and VvC (waveform 1111) may be applied after each of the program voltages 1103 and 1104. After several additional program loops, not shown, E-, F- and G-state verify voltages of VvE, VvF, and VvG (waveform 1112) may be applied after the final program voltage 1106.

Figure 11B:
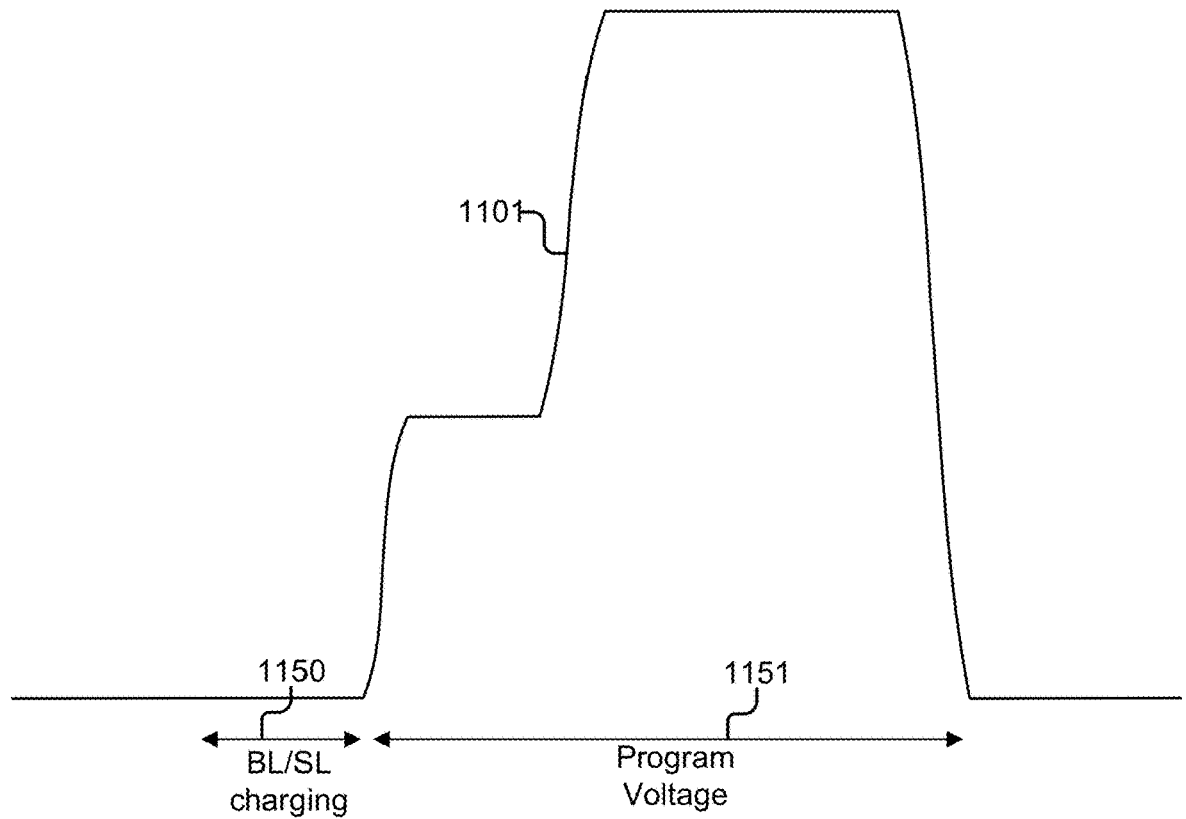
FIG. 11B depicts an example of the program voltage of FIG. 11A and a preceding bit line and/or source line charging period.

FIG. 11B depicts an example of the program voltage 1101 of FIG. 11A and a preceding bit line and/or source line charging period. The program voltage may be applied to a set of memory cells connected to a selected word line. In the set, some of the cells are biased at their bit line and/or source line to allow programming and some may be biased to inhibit programming. Moreover, as mentioned, of the cells being programmed, the bit line and/or source line voltages can be elevated from a reference voltage (e.g., 0 V) to control the programming speed based on their assigned data state.

The program voltage may initially step up to an intermediate level, Vpass, before stepping up to its peak level, Vpgm, in a program voltage time period 1151. For example, a time period 1150 can be for charging up or setting the bit line (BL) and/or source line (SL) voltages to respective non-zero, positive levels. Generally, it is desirable for these voltages to be set before the program voltage is applied since the BL/SL voltages control the programming speed of the respective memory cell to which the bit line and source line are connected. Optionally, the charge up period could overlap with the program voltage, at the start of the time period 1151. Performing the charge up while the program voltage is at Vpass could be acceptable since Vpass does not have a strong programming effect.

Figure 11C:
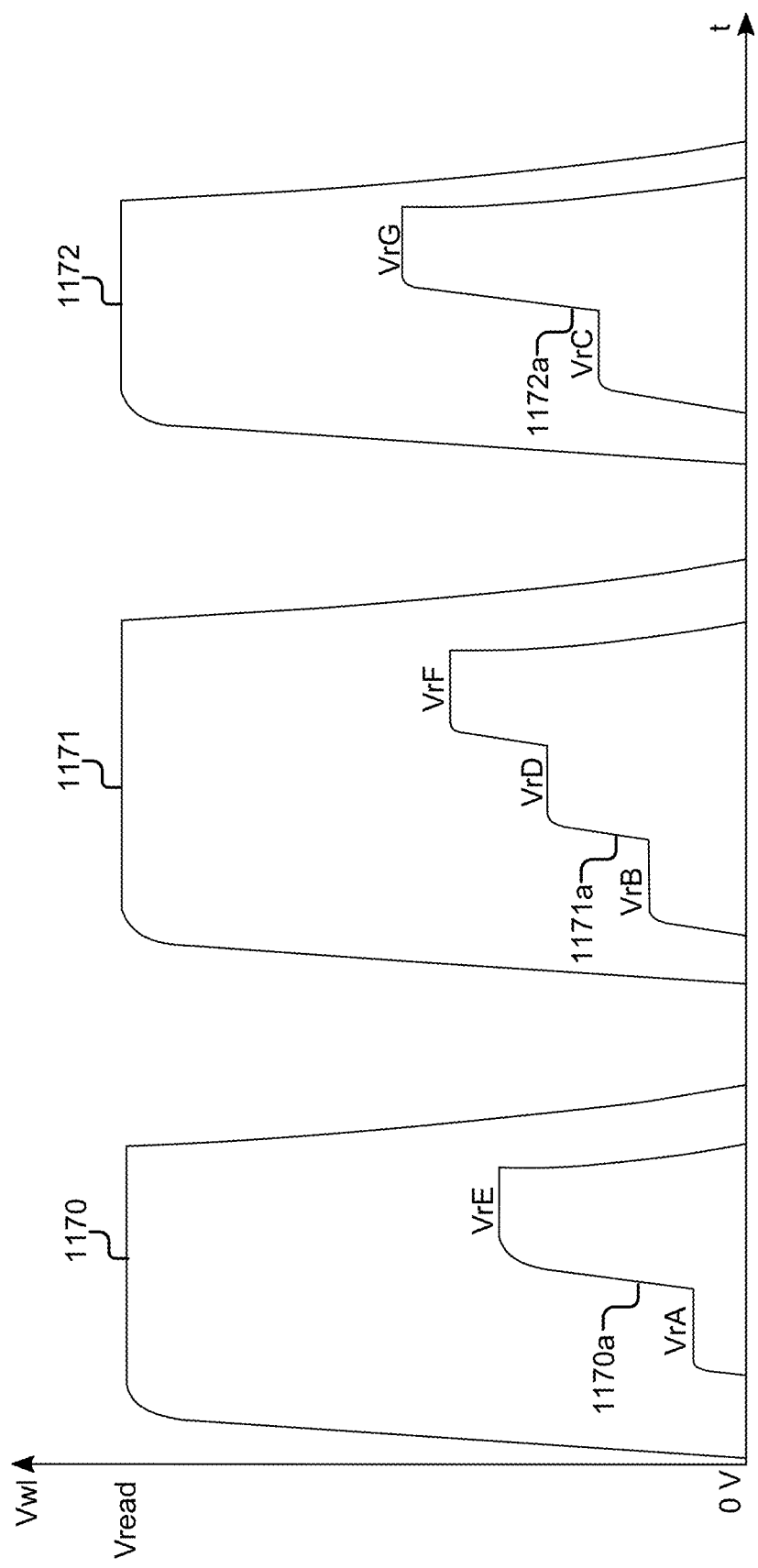
FIG. 11C depicts a plot of example waveforms in a read operation.

FIG. 11C depicts a plot of example waveforms in a read operation. A read operation may involve reading a number of pages of data. A control gate read voltage is applied to a selected word line while a pass voltage, Vread, is applied to the remaining unselected word lines. A sense circuit is then used to determine whether a cell is in a conductive state. Vread is ramped up and then back down separately during the read voltages of each of the lower, middle, and upper pages as depicted by plots 1170, 1171 and 1172, respectively. This example waveform is for an eight-state memory device with three pages of data. The example can be modified for fewer states (e.g., four states and two pages) or additional states (e.g., sixteen states and four pages).

By way of further example, for the first page, the A and E states are read using a read voltage waveform 1170a having voltages of VrA and VrE, respectively. For the second page, the B, D and F states are read using a read voltage waveform 1171a having voltages of VrB, VrD, and VrF, respectively. For the third page, the C and G states are read using a read voltage waveform 1172a having voltages of VrC and VrG, respectively. E.g., see FIG. 12. Optionally, the bit line and/or source line can be charged up in a read operation. The charging up can occur during the ramp-up of each sense voltage, for instance.

Figure 12:
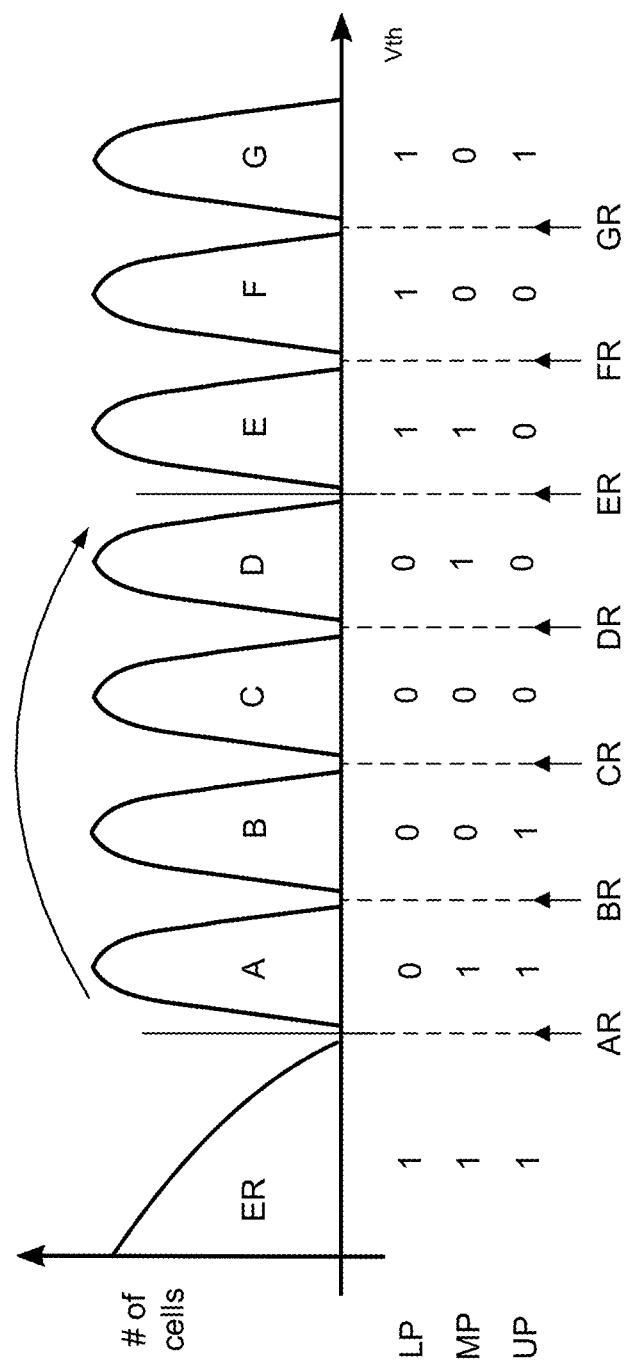
FIG. 12 depicts an example encoding of bits and a series of read voltages corresponding to data states of a set of memory cells in which eight data states are used.

FIG. 12 depicts an example encoding of bits and a series of read voltages corresponding to data states of a set of memory cells in which eight data states are used. FIG. 12, in particular, depicts three pages of data stored in the format of lower page (LP), middle page (MP), and upper page (UP) using three bits per cell, although it should be understood that other configurations are possible and contemplated. By way of further illustration, a current sensing operation can involve applying multiple and consecutive read voltages to a word line coupled to the set of memory cells for reading a bit corresponding to a page. For example, an LP read uses a sequence of two word line read voltages: AR and ER. When voltage AR is applied to the word line, the set of memory cells corresponding to the ER state are in the 'on' state and the set of memory cells corresponding to the states A-G remain in the 'off' state. Next, when voltage ER is applied to the word line, the set of memory cells corresponding to states A-D are now turned 'on' and the set of memory cells in states E to G remain in the 'off' state. The memory cells corresponding to the states A to D undergo a transition from the 'off' state to the 'on' state for the LP read.

Figure 13A:
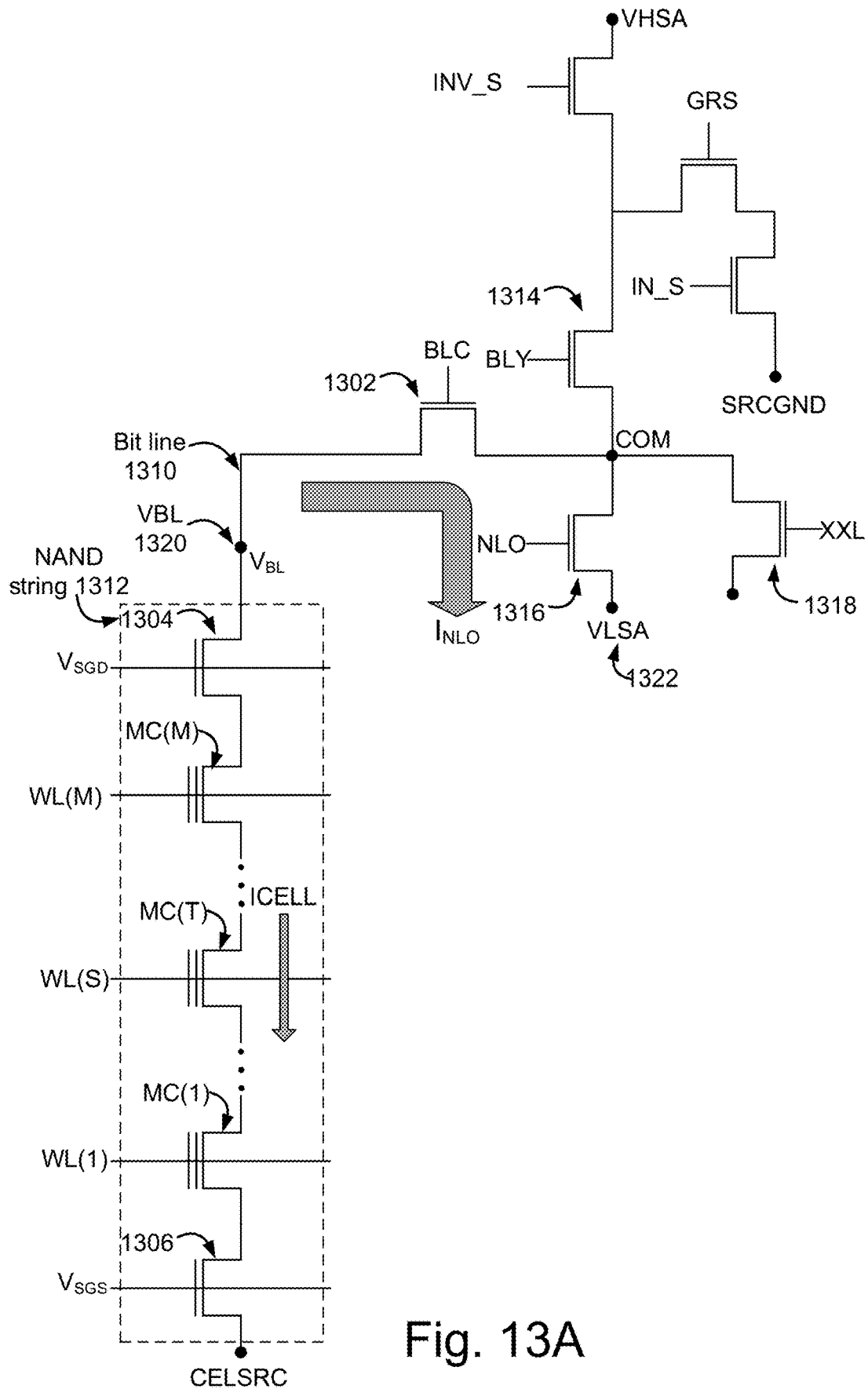
FIG. 13A depicts a configuration of a NAND string including a current discharge path through to a voltage terminal of a sense amplifier circuit.

FIG. 13A depicts a configuration of a NAND string including a current discharge path through to a voltage terminal of a sense amplifier circuit. As described herein, a sense operation may be performed on a group of target memory cells of a block that are connected to the same word line as part of a given read operation or a given verify operation (or a verify portion of a program-verify operation). Alternatively, in a block, one memory cell in each of the NAND strings may share the same word line. During a sense operation, the word line that is connected to a target memory cell is referred to as a selected word line. Conversely, a word line that is not connected to a target memory cell during a sense operation is referred to as an unselected word line. For the given read operation, the target memory cells are those memory cells in a block from which data values are to be determined. For the given verify operation, the target memory cells are those memory cells in a block into which data is being programmed. One or more of the sense blocks 130 shown in FIGS. 2 and 3 may be involved in one or more sense operations that are part of the given read operation or the given verify operation. During a sense operation, the bit line that is connected to a target memory cell is referred to as a selected bit line. Conversely, a bit line that is not connected to a target memory cell during a sense operation is referred to as an unselected bit line. In this context, a state of the bit line may refer to whether the bit line is selected or unselected. Otherwise stated, a bit line can be in one of two states, selected or unselected. During a sense operation, some bit lines of a block may be selected while others may be unselected. Whether a given bit line is selected or unselected may depend on whether a sense circuit controller is determining the current flow through that bit line. In one approach, for a given read operation, the control circuit and/or the one or more sense circuit controllers 360 (see FIG. 3) may identify the selected and unselected bit lines according to a predetermined read scheme that is used in order to identify the threshold voltages $V_{TH}$ of the memory cells, and in turn identify the data values of the data the target memory cells are storing. Similarly, for a given verify operation, the control circuit and/or the one or more sense circuit controllers 360 may identify the selected and unselected bit lines according to a program scheme that is used to program the target memory cells into various, different programmed states.

In the simplified example configuration of a sense amplifier circuit in FIG. 13A, a NAND string 1312 includes an M-number of memory cells MC(1) to MC(M) which are in communication with an M number of word lines WL(1) to WL(M). In practice, any suitable number of memory cells and word lines can be used, and are often arranged adjacent to one another in a block or other set of non-volatile memory cells, for example, as shown in FIG. 8. For purposes of illustration, one of the memory cells MC(1) to MC(M) is identified as being a target memory cell MC(T). The target memory cell MC(T) is connected to a selected word line WL(S). For a read operation, the target memory cell MC(T) is a memory cell from which data is to be read and thus, for which a sense operation is performed. For a verification operation, the target memory cell MC(T) is a memory cell being programmed in an associated program-verify operation. FIG. 13A also shows the NAND string 1312 including, on its drain side, a drain select gate transistor 1304 configured to receive a drain select gate voltage $V_{SGD}$ at its control gate, and including, on its source side, a source select gate transistor 1306 configured to receive a source select gate voltage $V_{SGS}$ at its control gate. The bit line 1310 is connected to a drain side of the NAND string 1312 via a bit line bias node VBL 1320. In addition, the bit line 1310 is connected to a node CELSRC, which is connected to an associated source line SL. The node CELSRC may be biased with the cell source voltage Vcelsrc. The bit line 1310 may be one of a plurality bit lines and the NAND string 1312 may be one of a plurality of NAND strings included in a memory cell structure 126 of one of the memory die 108.

In one implementation, the arrangement in FIG. 13A may operate in a no-lockout mode of sensing, such as no-lockout read/no-lockout program-verify mode. For example, the bit line 1310 may be a selected bit line and configured to be biased with a bit line bias voltage $V_{BL}$ from a supply voltage provided to the sense amplifier circuit through a first voltage terminal (e.g., VLSA 1322). The bit line 1310 is coupled to VLSA 1322 through a no-lockout path including the BLC transistor 1302 and the NLO transistor 1316. VLSA 1322 is coupled to one of the power supply sources for the sense amplifier circuit (not shown in full in FIG. 13A) that provide the supply voltage. The supply voltage, as referred to herein, includes an input or source voltage provided to the sense amplifier circuit to enable the operation of the sense amplifier circuit. The BLC transistor 1302 is disposed between the communication (COM) node and the NAND string 1312 and the bit line 1310. The BLC transistor 1302 facilitates communication between the NAND string 1312, and/or the bit line 1310 with rest of the sense amplifier circuit. For example, when the BLC transistor 1302 and the NLO transistor 1316 are turned on, a voltage supply from VLSA 1322 is coupled to the bit line 1310 for biasing. Thus, the bias voltage $V_{BL}$ for biasing the bit line 1310 is provided via the no-lockout path from VLSA 1322 in no-lockout mode. In one embodiment, the bias voltage $V_{BL}$ may be within a range from a negative voltage supply (e.g., for erasing) to a high positive voltage supply (e.g., for program pulses). In another embodiment, the bias voltage $V_{BL}$ may be within a range from 0 volts to an inhibit voltage. In a further embodiment, as described above, the voltage supplied by the VLSA 1322 may be controlled between 0 volts (e.g., ground) and about 2.5 volts, with about 100 mV step size, so that there are approximately 25 different bias voltages that can be applied to the bit line 1310. In another embodiment, VLSA 1322 may be configured to provide a different range of bias voltages, and/or different step sizes within the range. In another embodiment, VLSA 1322 may be coupled to a power supply multiplexer for toggling between a supply voltage and a lower supply level (e.g., Vss).

In FIG. 13A, the selected word line WL(S) connected to the target memory cell MC(T) may be biased with a sensing voltage at a certain voltage level Vcgr, such as a certain read voltage level or a certain verify voltage level. A sensing voltage, as used herein, includes a word line voltage applied to the selected word line WL(S) to enable the sense amplifier circuit to sense current flowing through a selected bit line by way of the memory cell and determine a state of the memory cell which state represents a data value that the target memory cell MC(T) is storing. The sense amplifier circuit also uses a sensing voltage to verify that data has been correctly programmed into the target memory cell MC(T). The target memory cell MC(T) may behave or respond differently to a certain biasing condition depending on its status. That is, memory cells with different statuses may respond differently to the same set of biasing conditions. One way a target memory cell MC(T) responds or behaves differently is by drawing different amounts of current through the bit line 1310. When the word line voltage is increased from one word line level (e.g., AR in FIG. 12) to the next word line level (e.g., ER in FIG. 12) in a sequential sensing operation, the target memory cell MC(T) may undergo a transition from an 'off' state to an 'on' state if the gate-to-source voltage of the target memory cell MC(T) is greater than the threshold voltage Vth of the target memory cell MC(T). In other words, the target memory cell MC(T) may go from being in a non-conductive state to a conductive state when the word line voltage is increased on the selected word line WL(S).

Figure 14:
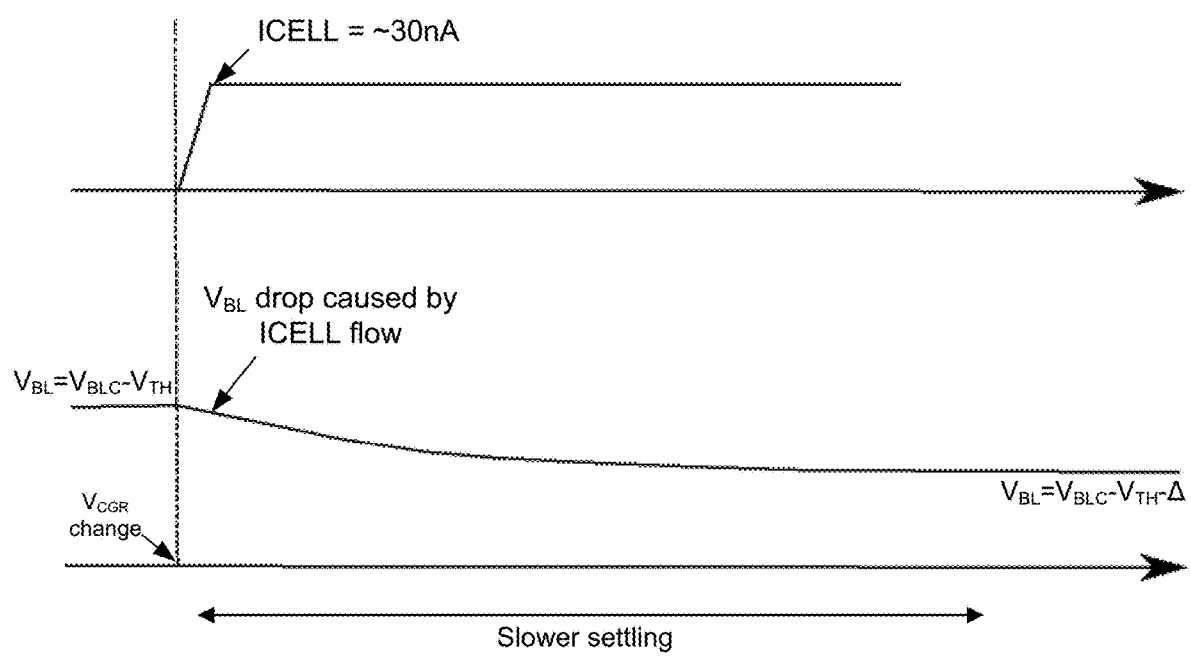
FIG. 14 depicts an example plot of a relationship between currents flowing in the bit line and a voltage of the bit line.

As an illustration, FIG. 14 depicts an example plot of a relationship between current ICELL flowing in the bit line 1310 and a voltage of the bit line $V_{BL}$. After an increase in Vcgr (e.g., a sensing voltage) on a selected word line, the memory cell current (ICELL) may be drawn through the bit line 1310 into the CELSRC node when the target memory cell MC (T) switches from an 'off' state to an 'on' state. See FIG. 13A. The flow of ICELL causes $V_{BL}$ to drop from $V_{BLC}$-$V_{TH}$. $V_{BLC}$ is control gate voltage applied to the BLC transistor 1302 and $V_{TH}$ is the threshold voltage of the BLC transistor 1302. However, the speed of settling of $V_{BL}$ to a desired steady level of $V_{BLC}$-$V_{TH}$-$\Delta$ is slowed down because the value of ICELL is small, at about 30 nA. The bit line 1310 is highly resistive and capacitive and the small ICELL sinking into the CELSRC node takes a long time to discharge a capacitance of the bit line 1310.

Returning to FIG. 13A, the sense amplifier circuit may be configured to drain at least a part of the charge stored on VBL 1320. In one implementation, the sense amplifier circuit is configured to create a path for sinking a current from VBL 1320 to a different node or location in the sense amplifier circuit. An example of a different node or location is a voltage terminal supplying a voltage to the sense amplifier circuit, such as VLSA 1322. The voltage supplied by VLSA 1322 to the sense amplifier circuit is lowered for a predetermined duration in response to control signals from the control circuit. For example, the voltage supplied by VLSA 1322 is lowered from a supply voltage level (e.g., 2.5V) to a first level (e.g., 0V). Specifically, because the VBL 1320 is at a higher voltage potential to VLSA 1322 in the predetermined duration, charge at the VBL 1320 can flow to the lower potential of the VLSA 1322. This causes voltage $V_{BL}$ to be pulled down and $V_{BL}$ quickly settles to a steady state level for the bit line 1310 to be sensed. The BLC transistor 1302 and the NLO transistor 1316 are turned on (e.g., made conductive) in response to control signals from the control circuit to create an electrical no-lockout path from VBL 1320 to VLSA 1322. As such, the no-lockout path through the BLC transistor 1302 sinks current Imo, which is much stronger than ICELL, into VLSA 1322. Also, the no-lockout path is shorter because VBL 1320 is closer to VLSA 1322. The sinking of current $I_{NLO}$ drains the charge stored on VBL 1320 and thereby settles the voltage $V_{BL}$ of the bit line 1310 quickly for a sense operation, such as a read or verify operation. The rate of settling of voltage $V_{BL}$ may be proportional to a difference in the voltage drop between the supply voltage level (e.g., 2.5V) and the first level (e.g., 0V). After the voltage $V_{BL}$ has settled, the voltage supplied by VLSA 1322 is raised back up to a supply voltage level (e.g., 2.5 volts). The no-lockout path also provides for a quick charge up of VBL 1320 if the voltage $V_{BL}$ goes to settle below a desired level. When sensing multi-state data, such as illustrated above with respect to FIGS. 10A-10B, the discharge through a path such as the no-lockout path provides a significant performance gain for additional sensing after a first sense operation for a first data state.

The sense amplifier circuit is configured to wait for $V_{BL}$ to settle before it can sense the current ICELL. After $V_{BL}$ settles, the sense amplifier circuit is configured to sense an amount of the cell current ICELL conducted or drawn through the bit line 1310 and sunk into the CELSRC as part of a sense operation associated with the target memory cell MC(T), such as a read operation to read data that the target memory cell MC(T) is storing or a verify operation to verify that data is sufficiently programmed in the target memory cell MC(T). Based on the current sensing that the sense amplifier circuit performs, the sense amplifier circuit may generate and output a sense result signal on an output node or communications bus via the XXL transistor 1318 that indicates a status of the target memory cell MC(T). For example, an amount of current drawn through the bit line 1310 determines a status of the target memory cell MC(T). In particular, if the target memory cell MC(T) is in a conductive state due to the application of a sensing voltage, a relatively high current flows. If the selected memory cell is in a non-conductive state, no or relatively little current flows. In one possible approach, the sense amplifier circuit uses a cell current discriminator as a comparator of current levels to determine whether the conduction current is higher or lower than a given demarcation current.

Figure 13B:
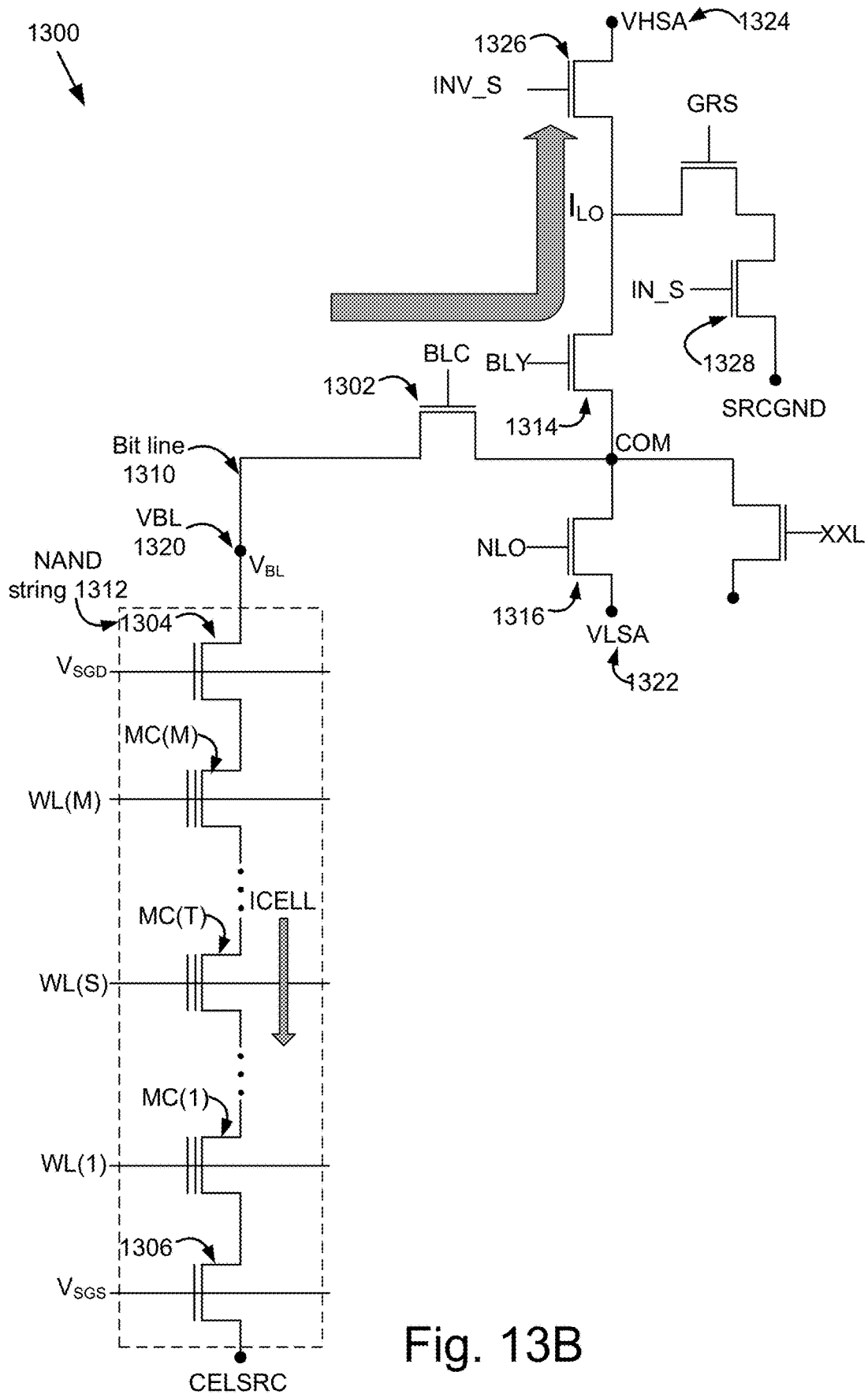
FIG. 13B depicts another configuration of a NAND string including a current discharge path through to a voltage terminal of a sense amplifier circuit.

FIG. 13B depicts another configuration of a NAND string including a current discharge path through to a voltage terminal of a sense amplifier circuit. In one implementation, the arrangement in FIG. 13B may operate in a lockout mode of sensing, such as lockout read/lockout program-verify mode. A sensing operation can be of the lockout type or no lockout type depending on the application. When reading multi-state data, such as illustrated above with respect to FIGS. 10A-10B, the memory typically starts with the lowest state and works its way up through the higher states. Once a memory cell is read and determined to be in, say, the A state, it does not need to be checked for the B and higher states; and if the memory cell is read for these higher states, they will be conducting, wasting current while providing no additional information. In other words, if the memory cell conducts enough to discharge the bit line at, say, the second sensing voltage, repeating the process again at a third, higher sensing voltage will supply no additional information, but only serve to waste the current used for it and any subsequent sensing. To avoid this, the sense amplifier circuit can use a "lockout" mode where, once a memory cell's state is determined, that bit line is locked out from further reading for other, higher states until that page is finished and the memory operation moves on to a new page. Consequently, a lockout mode of operation may use less current, but at the cost of greater complexity and lower performance.

In FIG. 13B, the bit line 1310 may be a selected bit line and configured to be biased with a bit line bias voltage $V_{BL}$ from a supply voltage provided to the sense amplifier circuit through a second voltage terminal (e.g., VHSA 1324). VHSA 1324 is coupled to one of the other power supply sources for the sense amplifier circuit that provide the supply voltage. The bit line 1310 is coupled to VHSA 1324 through a lockout path including the BLC transistor 1302, the BLY transistor 1314, and the INV_S transistor 1326. For example, when the BLC transistor 1302, the BLY transistor 1314, and the INV_S transistor 1326 are turned on, a voltage supply from VHSA 1324 is coupled to the bit line 1310 for biasing. Thus, the bias voltage $V_{BL}$ for biasing the bit line 1310 is provided via the lockout path from VHSA 1324 in the lockout mode. In one embodiment, as described above, the voltage supplied by the VHSA 1324 may be controlled between 0 and about 2.5 volts, with about 100 mV step size. In another embodiment, VHSA 1324 may be configured to provide a different range of bias voltages, and/or different step sizes within the range. In another embodiment, VHSA 1324 may be coupled to a power supply multiplexer for toggling between a supply voltage and a lower supply level (e.g., Vss).

In the implementation of FIG. 13B, when the voltage on the selected word line WL(S) connected to the target memory cell MC(T) is raised from one sensing voltage to a next sensing voltage, the target memory cell MC(T) may turn on and draw ICELL through the bit line if the gate-to-source voltage of the target memory cell MC(T) is greater than the threshold voltage Vth of the target memory cell MC(T). As described earlier with reference to FIGS. 13A and 14, ICELL is small. In order to settle $V_{BL}$ quickly, the sense amplifier circuit may be configured to accelerate a discharge of the charge stored on VBL 1320 (e.g., the capacitance of the bit line 1310) through one of the voltage terminals of the sense amplifier circuit, such as VHSA 1324 by creating a path for current flow. This is achieved by the control circuit ramping down a supply voltage of the VHSA 1324 to a certain low voltage for a predetermined duration. When the voltage supplied by VHSA 1324 is lesser than a supply voltage level (e.g., 2.5 volts), VHSA 1324 is at a lower potential to VBL 1320. As a consequence, a charge stored on VBL 1320 can flow to VHSA 1324 when the BLC transistor 1302, BLY transistor 1314 and INV_S transistor 1325 are turned on to create an electrical lockout path from VBL 1320 to VHSA 1324. The resulting current $I_{LO}$ (stronger than ICELL) sinks into VHSA 1324 through the lockout path which discharges the charge stored on VBL 1320. Once $V_{BL}$ has settled, the control circuit ramps up the voltage supplied by VHSA 1324 back up to the supply voltage level.

Additionally, the sense amplifier circuit is connected to and/or in communication with a latch or latch circuit (not shown in FIGS. 13A and 13B), which, for at least some example configurations, may be representative of one of a plurality or collection of latches that the sense amplifier circuit communicates with to perform sense operations. See FIG. 2. For example, other latches may include data latches configured to store data that is to be programmed into the target memory cell MC(T) or data that is sensed from the target memory cell MC(T). For clarity, the sense amplifier circuit, the bit line 1310, the NAND string 1312 connected to the bit line 1310, and the latch are referred to as all being associated with each other. Accordingly, reference to a latch being associated with the bit line 1310 means that the latch is connected to the same sense amplifier circuit as the bit line 1310.

In FIG. 13B, the latch data from the latch circuit is input to gates of transistor INV_S 1326 and IN S transistor 1328. As such, the discharge of VBL 1320 through the lockout path depends on the latch data. In one embodiment, the arrangement in FIG. 13B may be configured to discharge the charge stored on VBL 1320 through to VLSA 1322 using the no-lockout path including the BLC transistor 1302 and the NLO transistor 1316. For example, the transistor BLY 1314 can be turned off to disable the lockout path from VBL 1320 to VHSA 1324. The transistor NLO 1316 can be turned on to enable the no-lockout path from VBL 1320 to VLSA 1322 to discharge the charge stored on VBL 1320 by sinking current Imo into VLSA 1322. In other words, VBL may be charged up using the lockout path and discharged using the no-lockout path and/or vice versa.

In one embodiment, the latch circuit may have power supply connections (not shown in FIGS. 13A and 13B) that are independent of VLSA 1322 and VHSA 1324. In one embodiment, the sense amplifier circuit can be configured to create a path from VBL 1320 to one of the voltage terminals of the latch circuit to discharge the charge stored on VBL 1320. For example, an electrical path from VBL 1320 to the voltage terminal of the latch circuit can be configured in the sense amplifier circuit for purpose of discharging the bit line 1310 if the latch circuit is not occupied with a logic operation at the time of discharge.

Figure 15:
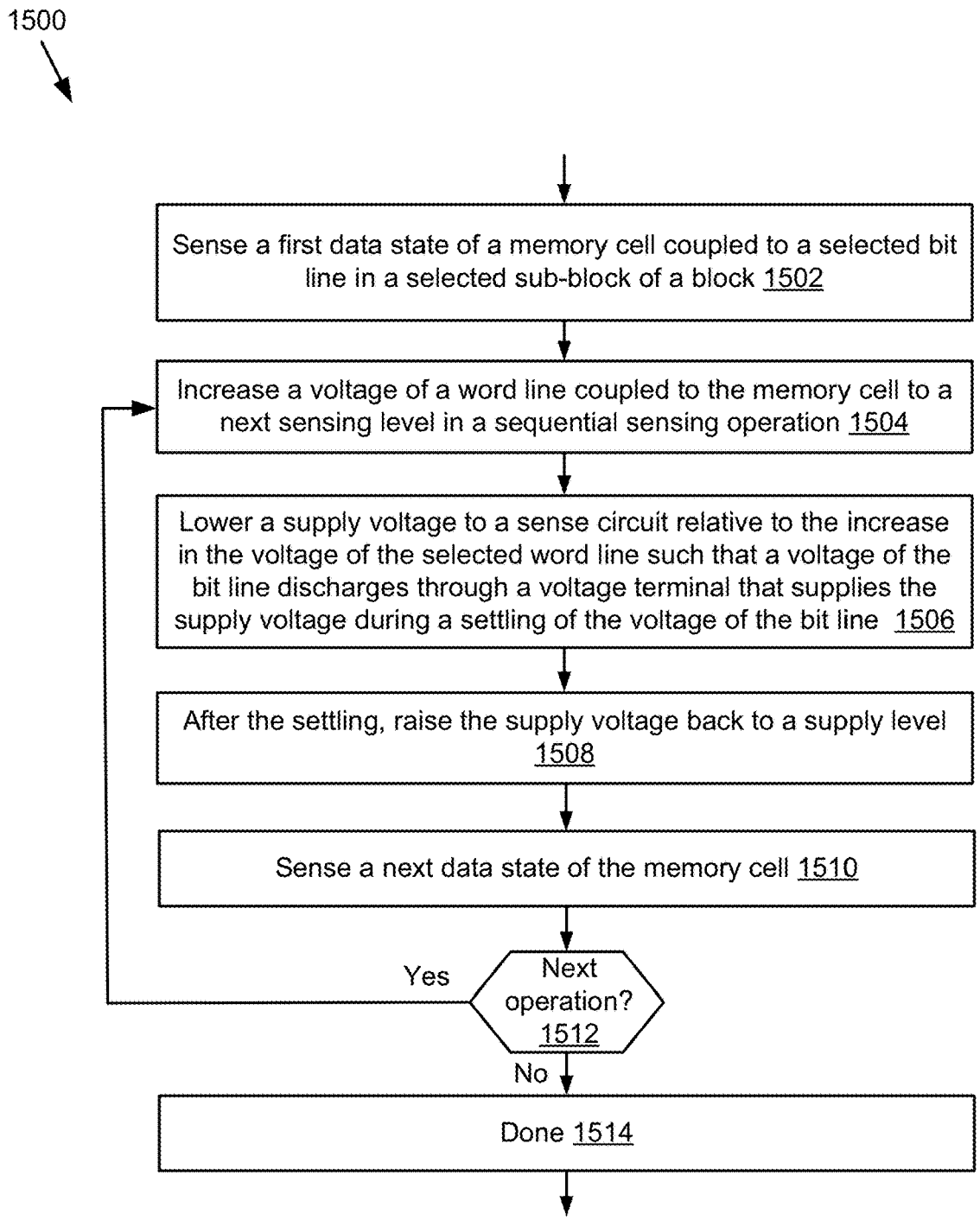
FIG. 15 depicts a flowchart of an example process for performing a sense operation.

FIG. 15 depicts a flowchart of an example sensing process 1500 which advantageously creates an electrical path for sinking current from a bit line through to a voltage terminal to facilitate faster bit line settling. A sensing process can occur, e.g., as a verify test in a programming operation, where the verify test determines whether the Vth of a memory cell exceeds a verify voltage of its assigned data state, or in a read operation which involves ascertaining the data state of a memory cell (after it has been programmed) by determining a highest read voltage which results in the memory cell being in a non-conductive state and/or a lowest read voltage which results in the memory cell being in a conductive state. A sensing process can involve sequentially applying one or more sensing voltages to a selected word line while current sensing whether the associated memory cells are in a conductive or non-conductive state.

Step 1502 begins by sensing a first data state of a memory cell which is coupled to a selected bit line in a selected sub-block of a block. For example, in FIG. 9, assume SB0 is the selected sub-block and SB1-SB3 are unselected sub-blocks. Step 1504 includes the row decoder circuit increasing a voltage of a selected word line coupled to the memory cell to a next sensing level in a sequential sensing operation. For example, see FIG. 16A, the voltage on the selected word line is increased from VrA to VrE to read a lower page of data. As another example, with eight data states as in FIGS. 10B and 12, a middle page may be read using VrB, VrD, and VrF and an upper page may be read using VrC and VrG.

Step 1506 includes the voltage supply circuit lowering a supply voltage to a sense circuit relative to the increase in the voltage of the selected word line such that a voltage of the bit line discharges through a voltage terminal that supplies the supply voltage during a settling of the voltage of the bit line. For example, see FIG. 16B. The memory cell turns on in response to the voltage (e.g., VrE) on the selected word line. In one embodiment, the voltage level of Vsense_supply (e.g., the voltage source of sense circuit) is lowered from a supply voltage level to a low voltage level. The discharge of the bit line occurs through a conductive BLC transistor when a current stronger than ICELL sinks into a voltage terminal corresponding to Vsense_supply. See FIGS. 13A and 13B. Turning on or providing the BLC transistor in a conductive state can involve applying a control gate voltage which exceeds the Vth of the BLC transistor, plus a margin.

Step 1508 includes the voltage supply circuit raising the supply voltage back to a supply voltage level. For example, see FIG. 16B. In one embodiment, the voltage of Vsense_supply is brought back up from the low voltage level to the supply voltage level. Step 1510 includes sensing a next data state of the memory cell. For example, the voltage of the bit line has settled for E-state of the memory cell to be sensed by the sense circuit. The read data from each page is output from the sense circuits to the controller, in one approach. A decision step 1512 determines if another sense operation is to be performed. If decision step 1512 is true, a next sense operation begins at step 1504. If decision step 1512 is false, the sensing operation is completed at step 1514. The steps depicted are not necessarily performed sequentially in the order shown. Instead, some steps can overlap.

FIGS. 16A to 16D depict example plots of voltages and currents in the sensing process of FIG. 15. A common timeline on a horizontal axis is used in these figures. In FIGS. 16A, 16B, and 16D, the vertical axis represents a voltage. In FIG. 16C, the vertical axis represents current. Time points t0, t1 . . . represent increasing time. The time points are not necessarily equally spaced or to scale.

FIG. 16A depicts an example plot 1602 of a voltage of a selected word line, $V_{WL}$. The starting and ending levels of the plot 1602 can be 0V, in one approach. Generally, the control circuit uses one or more control gate read levels in a sensing process. In this example, the sensing process is a sequential read operation of a lower page of data which uses control gate read levels of VrA and VrE, as shown in the eight-state example of FIG. 10B and FIG. 11C. VrA can be about 0-0.5 V in some examples, while VrE might be about 6 V. The control circuit sets $V_{WL}$ to VrA prior to t0 in the sequential read operation. At t0, the control circuit raises $V_{WL}$ from VrA to VrE in the sequential read operation.

FIG. 16B depicts an example plot 1604 of a voltage from a power supply terminal of the sense circuit, where a voltage toggle 1604a is applied to settle $V_{BL}$ in FIG. 16D. Vsense_supply can be from one of the voltage terminals driving a latch circuit and the bit lines. In one approach, just prior to t0, the control circuit lowers Vsense_supply from a supply voltage level to a low voltage level during a time period when $V_{BL}$ (depicted in plot 1608) is settling between t0 and t1. For example, the supply voltage level may be a range between about 2.2 V and about 2.5V and the low voltage level may be in a range between about 0V and 1V. In another approach, the control circuit may lower Vsense_supply from a supply voltage level to a low voltage level just after t0. In other words, the control circuit may lower Vsense_supply at a time instant relative to the increase of the voltage on the selected word line, $V_{WL}$. The control circuit lowers Vsense_supply for a predetermined duration. For example, the predetermined duration may be about 100 nanoseconds. The predetermined duration is relatively short, in one approach, compared to the duration of the sensing process. A rate of settling of $V_{BL}$ is proportional to a depth or offset in the voltage toggle 1604a from the supply voltage level. At t1, the control circuit raises Vsense_supply back up to the supply voltage level from the low voltage level. In one approach, the control circuit raises Vsense_supply back up to the supply voltage level from the low voltage level prior to cell current measure at t2 by the sense circuit.

In one embodiment, the voltage toggle 1604a provides the voltage terminal supplying the Vsense_supply at a lower potential to the bit line. The voltage toggle 1604a can beneficially create an electrical path for a charge on the bit line to flow by sinking current from the bit line through to the voltage terminal of Vsense_supply (and address the negative effects described elsewhere herein, such as with respect to FIG. 14) to provide faster bit line settling. For instance, by selectively decreasing Vsense_supply during the time in which $V_{BL}$ is settling, the current from the bit line sinking into the voltage terminal is stronger than $I_{CELL}$ which can shorten the settling time of $V_{BL}$ by a factor of about 10. As a further example, the voltage toggle 1604a reduces the settling time of $V_{BL}$ from about 11 microseconds to about 1 microsecond. In other words, the current sinking into the voltage terminal of Vsense_supply speeds up a discharge of a capacitance of the bit line resulting in $V_{BL}$ settling quickly.

FIG. 16C depicts a first example plot 1606 of a memory cell current $I_{CELL}$. At t0, $I_{CELL}$ starts to flow in the NAND string if a selected memory cell is transitioning from an off state to an on state in response to the control circuit raising $V_{WL}$, from VrA to VrE, in plot 1602. At t2, $I_{CELL}$ is measured by the sense circuit.

FIG. 16D depicts an example plot 1608 of the voltage of the bit line, $V_{BL}$. Prior to t0, $V_{BL}$ at an initial voltage (e.g., 1.5 V) because the selected memory cell is non-conductive at the control gate read level of VrA. At t0, $V_{BL}$ is lowered in response to a selected memory cell transitioning from the 'off' state to the 'on' state and $I_{CELL}$ flowing in the NAND string. The transition of the selected memory cell from the 'off' state to the 'on' state is complete when the bit line is discharged at t1. For example, $V_{BL}$ discharges from the initial voltage (e.g., 1.5 V) to a new voltage (e.g., 1.4 V) in about 1 microsecond between t0 and t1. As depicted in FIG. 14, without the voltage toggle 1604a on Vsense_supply, the settling of $V_{BL}$ is slower. With voltage toggle 1604a on Vsense_supply, the settling of $V_{BL}$ is advantageously faster.

Multiple sensing operations can be performed successively, for example, one for each verify or read level in a sequential sensing scheme. In one approach, the same source and p-well voltages (not shown) are applied in each sense operation, but the selected word line voltage is changed. Thus, in a first sensing operation, a first voltage can be applied to the control gate/word line of a selected memory cell, the source voltage applied to the source, and the p-well voltage applied to the p-well. A determination is then made as to whether the memory cell is in a conductive state or a non-conductive state using current sensing while applying the first voltage and the source voltage. In the first sensing operation, there may be noise and a transition of memory cells from 'on' state to 'off' state is dominant. A second sensing operation includes applying a second voltage to the control gate while applying the same source and p-well voltages. The voltage toggle on Vsense_supply is applied after applying the second voltage or higher voltages in the sequential sensing scheme. This is because a transition of memory cells from 'off' state to 'on' state is dominant in the second sensing operation and later. The negative kick on Vblc is applied to improve the transition of memory cells from 'off' state to 'on' state. Successive sensing operations similarly can vary the selected word line voltage while using the voltage toggle on Vsense_supply.

Further, sensing can be performed concurrently for multiple memory cells which are associated with a common word line and source. The multiple memory cells may be in adjacent or non-adjacent NAND strings. All bit line sensing involves concurrent sensing of memory cells in adjacent NAND strings. In this case, the sensing includes determining, in concurrent sensing operations, whether each of the non-volatile memory cells is in the conductive or non-conductive state using current sensing.

The means described in the present disclosure can include the components of the memory device 100 of FIG. 1, for example. The power control module 116, for instance, controls the power and voltages supplied to the word lines, select gate lines, and bit lines during memory operations. Moreover, the means described above can include the components of FIG. 4 including the decoders, voltage drivers, switches, and pass transistors. The means can further include any of the control circuits in FIG. 1 such as the control circuitry 110 and controller 122.

In various embodiments, the means for toggling a supply voltage of a sense circuit can include the power control/program voltage circuit 116, the toggle power circuit 119 of FIG. 1 and the bit line voltage source 440 of FIG. 4, or other logic hardware, and/or executable code stored on a computer-readable storage medium. Other embodiments may include similar or equivalent means for transmitting data.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. An apparatus, comprising:
a control circuit coupled to a set of memory cells, the control circuit comprising:
a row decoder circuit configured to increase a sensing voltage on a selected word line coupled to the set of memory cells; and
a voltage supply circuit configured to lower a supply voltage to a sense circuit responsive to the sense circuit sensing a first data state of a memory cell such that a voltage of a selected bit line discharges through a voltage terminal that supplies the supply voltage in association with the memory cell transitioning from a non-conductive state to a conductive state, the memory cell coupled to the selected bit line.

2. The apparatus of claim 1, wherein:
the voltage supply circuit is configured to lower the supply voltage relative to the increase of the sensing voltage.

3. The apparatus of claim 1, wherein:
the voltage supply circuit is configured to lower the supply voltage from a first level to ground.

4. The apparatus of claim 3, wherein:
the voltage supply circuit is further configured to raise the supply voltage from the ground back up to the first level in response to the voltage of the selected bit line discharging from an initial level to a new level.

5. The apparatus of claim 4, further comprising:
the sense circuit configured to sense a second data state of the memory cell in response to the voltage supply circuit raising the supply voltage.

6. The apparatus of claim 3, wherein the voltage supply circuit is configured to lower the supply voltage from the first level to ground to shorten a settling time of the voltage of the selected bit line by a factor of about 10.

7. The apparatus of claim 1, wherein:
the row decoder circuit is configured to apply a series of increasing sensing voltages to the selected word line during a sequential sensing operation; and
the voltage supply circuit is configured to lower the supply voltage relative to the increase of the sensing voltage to a second level or higher in the series of the increasing sensing voltages.

8. The apparatus of claim 1, wherein the voltage of the selected bit line is discharged through a path connecting the selected bit line to the voltage terminal.

9. A system comprising:
a control circuit coupled to a set of memory cells and configured to sense a data state of a memory cell coupled to a bit line, the control circuit comprising:
  a row decoder circuit configured to increase a sensing voltage from a first read level to a second read level on a word line coupled to the set of memory cells;
  a current sense circuit configured to sense the data state of the memory cell corresponding to the sensing voltage; and
  in response to the current sense circuit sensing a first data state of the memory cell, a voltage supply circuit configured to decrease, from a first level to a second level, a supply voltage to the current sense circuit to accelerate discharge of a capacitance of the bit line through a voltage terminal supplying the supply voltage while the memory cell conducts a cell current in relation to the sensing voltage at the second read level.

10. The system of claim 9, wherein the voltage supply circuit is further configured to hold the supply voltage at the second level for a predetermined duration of time and then increase the supply voltage from the second level to the first level.

11. The system of claim 9, wherein the voltage supply circuit is further configured to increase the supply voltage from the second level back up to the first level in response to a settling of a voltage of the bit line.

12. The system of claim 9, wherein the current sense circuit is further configured to sense a second data state of the memory cell in response to a settling of a voltage of the bit line.

13. The system of claim 9, wherein the first level is a range between about 2.2V and about 2.5V and the second level is a range between about 0V and about 1V.

14. The system of claim 9, wherein a rate of settling of a voltage of the bit line is proportional to a difference in voltage drop between the first level and the second level.

15. The system of claim 9, wherein the discharge of the capacitance of the bit line through the voltage terminal reduces a settling time of a voltage of the bit line by a factor about 10.

16. A method comprising:
raising, during sensing of data states, a voltage on a selected word line from a first sensing voltage to a second sensing voltage, the selected word line coupled to a set of memory cells;
in response to sensing a first data state of a memory cell, sinking current from a selected bit line of the memory cell through a voltage terminal driving the selected bit line by ramping down a supply voltage of the voltage terminal during a turning on of the memory cell in relation to the second sensing voltage; and
after a predetermined duration, ramping up the supply voltage of the voltage terminal.

17. The method of claim 16, wherein sinking the current settles a voltage of the selected bit line.

18. The method of claim 16, further comprising sensing a second data state of the memory cell in response to ramping up the supply voltage of the voltage terminal.

19. The method of claim 16, wherein sinking the current reduces a settling time of a voltage of the selected bit line from about 11 microseconds to about 1 microsecond.

20. The method of claim 16, wherein the predetermined duration is about 100 nanoseconds.

* * * * *